United States Patent
Yeo et al.

(10) Patent No.: US 11,330,536 B2
(45) Date of Patent: May 10, 2022

(54) APPARATUS AND METHOD FOR CONTROLLING GAIN OF RECEIVED SIGNAL IN WIRELESS COMMUNICATION SYSTEM

(71) Applicant: Samsung Electronics Co., Ltd., Suwon-si (KR)

(72) Inventors: Jeongho Yeo, Suwon-si (KR); Yangsoo Kwon, Suwon-si (KR); Younsun Kim, Suwon-si (KR); Hyunseok Ryu, Suwon-si (KR); Jinyoung Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/921,263

(22) Filed: Jul. 6, 2020

(65) Prior Publication Data
US 2021/0007064 A1    Jan. 7, 2021

(30) Foreign Application Priority Data
Jul. 5, 2019    (KR) ........................ 10-2019-0081109

(51) Int. Cl.
*H04W 24/10*    (2009.01)
*H04W 52/52*    (2009.01)
(Continued)

(52) U.S. Cl.
CPC ........... *H04W 52/52* (2013.01); *H04L 5/0055* (2013.01); *H04L 5/0092* (2013.01); *H04W 24/10* (2013.01);
(Continued)

(58) Field of Classification Search
CPC .... H04L 5/0044; H04L 5/0092; H04W 24/10; H04W 52/52; H04W 72/02; H04W 76/11; H04W 76/14
(Continued)

(56) References Cited

U.S. PATENT DOCUMENTS 6,563,891 B1    5/2003  Eriksson et al.
9,490,764 B2    11/2016 Ferrante et al.
(Continued)

FOREIGN PATENT DOCUMENTS

KR    10-2020-0036725 A    4/2020

OTHER PUBLICATIONS

Qualcomm Incorporated, Discussion on RRC based BWP switch delay, R4-1906988, 3GPP TSG RAN4 #91, May 3, 2019, Reno, USA, section 2.
(Continued)

*Primary Examiner* — Harun Chowdhury
(74) *Attorney, Agent, or Firm* — Jefferson IP Law, LLP

(57) ABSTRACT

The disclosure relates to a 5$^{th}$ generation (5G) or pre-5G communication system for supporting a higher data rate beyond a 4$^{th}$ generation (4G) communication system, such as Long Term Evolution (LTE). An operation method and a terminal are provided. The method includes acquiring information and determining an initial value for an automatic gain control (AGC) operation for a signal received from a transmission device, receiving a signal from the transmission device, and performing the AGC operation for the received signal by using the initial value determined based on the information.

14 Claims, 36 Drawing Sheets

(51) Int. Cl.
  *H04W 76/11*  (2018.01)
  *H04L 5/00*   (2006.01)
  *H04W 72/02*  (2009.01)
  *H04W 52/24*  (2009.01)
  *H04W 92/18*  (2009.01)

(52) U.S. Cl.
  CPC ......... *H04W 52/241* (2013.01); *H04W 72/02* (2013.01); *H04W 76/11* (2018.02); *H04W 92/18* (2013.01)

(58) Field of Classification Search
  USPC ........................................ 370/252, 329, 330
  See application file for complete search history.

(56) References Cited

U.S. PATENT DOCUMENTS

| | | | |
|---|---|---|---|
| 2013/0272262 A1 | 10/2013 | Li et al. | |
| 2019/0110325 A1* | 4/2019 | Gulati ................... | H04W 76/14 |
| 2020/0389246 A1* | 12/2020 | Wu ....................... | H04L 5/0044 |
| 2021/0112505 A1* | 4/2021 | Li .......................... | H04W 52/52 |
| 2021/0119760 A1* | 4/2021 | Jiang ..................... | H04W 76/14 |

OTHER PUBLICATIONS

Qualcomm Incorporated, AGC settling time for NR FR1 V2X, R4-1906944, 3GPP TSG RAN4 #91, May 3, 2019, Reno, USA, section 2.

International Search Report dated Oct. 22, 2020, issued in International Application No. PCT/KR2020/008757.

\* cited by examiner

| Logical slot index | 1 | 2 | 3 | 4 | 5 | 6 | 7 | 8 | 9 | 10 | 11 | 12 | 13 |
|---|---|---|---|---|---|---|---|---|---|---|---|---|---|
| Slot | n-2 | n-1 | n | n+1 | n+2 | n+3 | n+4 | n+5 | n+6 | n+7 | n+8 | n+9 | n+10 | n+11 | n+12 | n+13 | n+14 | n+15 | n+16 |
| Whether to be included in resource pool | O | O | O | X | O | O | O | X | X | X | O | O | O | O | O | O |
| Whether to be capable of transmitting PSFCH | O | X | O | X | X | O | O | X | X | X | X | O | X | O | X | O |
| Slot in which PSSCH corresponding to HARQ-ACK feedback to be included in PSFCH has been transmitted | n-2<br>n-1 | n+2<br>n-1 | | | n<br>n-2 | | n+3<br>n+4 | | | | n+8<br>n+11 | | n+12<br>n+13 | | n+14<br>n+15 |

FIG.21

APPARATUS AND METHOD FOR CONTROLLING GAIN OF RECEIVED SIGNAL IN WIRELESS COMMUNICATION SYSTEM

CROSS-REFERENCE TO RELATED APPLICATION(S)

This application is based on and claims priority under 35 U.S.C. § 119(a) of a Korean patent application number 10-2019-0081109, filed on Jul. 5, 2019, in the Korean Intellectual Property Office, the disclosure of which is incorporated by reference herein in its entirety.

BACKGROUND

1. Field

The disclosure relates to a wireless communication system. More particularly, the disclosure relates to an apparatus and a method for controlling a gain of a received signal in a wireless communication system.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (mmWave) bands, e.g., 28 GHz or 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In various communication systems, such as a 5G system, a device, such as a base station or a terminal may receive a signal and detect transmitted data by demodulating and decoding the received signal. To this end, the device includes a circuit for processing the received signal. In general, a technology of properly controlling a gain of a signal during processing of a wireless signal to maintain the size of a signal used for demodulation and decoding at a predetermined level is used. The technology may be referred to as "automatic gain control (AGC)". The performance of the AGC technology may affect the performance of demodulation and decoding, and thus optimizing the AGC technology based on a communication environment is required.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus and a method for effectively controlling a gain of a received signal in a wireless communication system.

An aspect of the disclosure is to provide an apparatus and a method for reducing automatic gain control (AGC) settling time in a wireless communication system.

An aspect of the disclosure is to provide an apparatus and a method for configuring an initial value of AGC in a wireless communication system.

Additional aspects will be set forth in part in the description which follows and, in part, will be apparent from the description, or may be learned by practice of the presented embodiments.

In accordance with an aspect of the disclosure, an method of a terminal in a wireless communication system is provide. The method includes acquiring information and determining an initial value for an automatic gain control (AGC) operation for a signal received from a transmission device, receiving a signal from the transmission device, and performing the AGC operation for the received signal by using the initial value determined based on the information. Here, the information may include information relating to the transmission device.

In accordance with another aspect of the disclosure, a terminal in a wireless communication system is provided. The terminal includes a transceiver, and at least one processor connected to the transceiver. The at least one processor may acquire information and determining an initial value for an automatic gain control (AGC) operation for a signal received from a transmission device, receive a signal from the transmission device, and perform the AGC operation for the received signal by using the initial value determined based on the information. Here, the information may include information relating to the transmission device.

An apparatus and a method according to an embodiment enables reducing automatic gain control (AGC) settling time.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 21 illustrates timing of transmitting feedback information corresponding to sidelink data in a wireless communication system according to an embodiment of the disclosure;

Throughout the drawings, it should be noted that like reference numbers are used to depict the same or similar elements, features, and structures.

DETAILED DESCRIPTION

Figure 1:
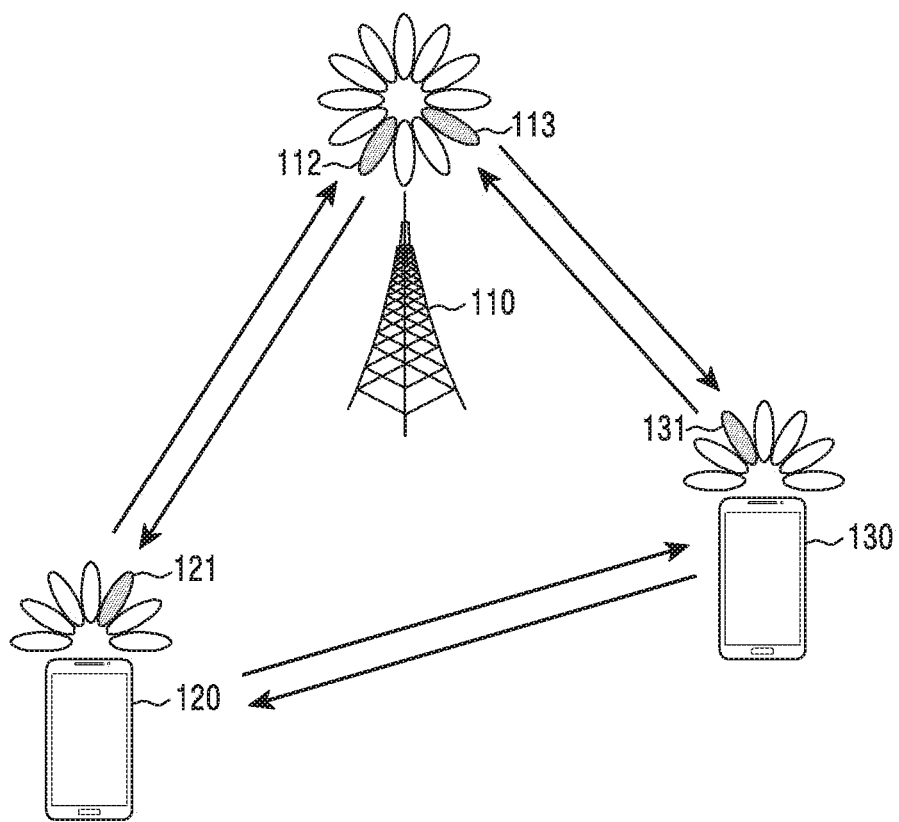
FIG. 1 illustrates a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms used in the disclosure are only used to describe specific embodiments of the disclosure, and are not intended to limit the disclosure. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, an embodiment of the disclosure will be described based on an approach of hardware by way of example. However, an embodiment of the disclosure includes a technology that uses both hardware and software, and thus the embodiment of the disclosure may not exclude the perspective of software.

Hereinafter, the disclosure relates to an apparatus and a method for controlling a gain of a received signal in a wireless communication system. Specifically, the disclosure describes a technology for performing an automatic gain control (AGC) operation performed in a reception circuit in a wireless communication system.

In the following description, terms referring to signals, terms referring to channels, terms referring to control information, terms referring to network entities, terms referring to device elements, and the like are illustratively used for the sake of convenience. Therefore, the disclosure is not limited by the terms as used below, and other terms referring to subjects having equivalent technical meanings may be used.

In the following description, a physical channel and a signal may be interchangeably used with data or a control signal. For example, a physical downlink shared channel (PDSCH) is a term referring to a physical channel through which data is transmitted, but PDSCH may be also used to refer to data.

Hereinafter, in the disclosure, higher signaling indicates a method of transmitting a signal from a base station to a terminal by using a downlink data channel of a physical layer, or a method of transmitting a signal from a terminal to a base station by using an uplink data channel of a physical layer. The higher signaling may be understood to be radio resource control (RRC) signaling or an MAC control element (CE).

Further, in the disclosure, although the expression "more than" or "less than" is used in order to determine whether or not a specific condition is satisfied or fulfilled, this is merely intended to express an example, and this does not exclude the meaning of "equal to or more than" or "equal to or less than" A condition described as the expression "equal to or more than" can be replaced with the expression "more than", a condition described as the expression "equal to or less than" can be replaced with the expression "less than", and a condition described as the expression "equal to or more than and less than" can be replaced with the expression "more than and equal to or less than".

Further, although the disclosure describes an embodiment using terms used in some communication standards (e.g., 3rd Generation Partnership Project (3GPP)), these are merely illustrative examples. An embodiment can be easily modified and applied to other communication systems as well.

FIG. 1 illustrates a wireless communication system according to an embodiment of the disclosure.

Referring to FIG. 1, it illustrates a base station 110, a terminal 120, and a terminal 130, as a part of nodes using a wireless channel in a wireless communication system. FIG. 1 illustrates a single base station, but may further include the same base station as the base station 110 or other base stations similar thereto.

The base station 110 is a network infrastructure for providing radio access to the terminals 120 and 130. The base station 110 has a coverage defined as a predetermined geographical region based on a distance within which a signal is transmitted. The base station 110 may be referred to as an "access point (AP)", an "eNodeB (eNB)", a "5th generation (5G) node", a "gNodeB (next generation nodeB or gNB)", a "wireless point", a "transmission/reception point (TRP)", or other terms having equivalent technical meanings to those of the above-described terms, in addition to the base station.

Each of the terminal 120 and the terminal 130 is a device used by a user, and performs communication with the base station 110 through a wireless channel. A link from the base station 110 to the terminal 120 or the terminal 130 is referred to as a downlink (DL), and a link from the terminal 120 or the terminal 130 to the base station 110 is referred to as an uplink (UL). Further, the terminal 120 and the terminal 130 may perform communication with each other through a wireless channel. In this case, a link between the terminal 120 and the terminal 130 is referred to as sidelink, and may be interchangeably used with a PC5 interface. In some cases, at least one of the terminal 120 and the terminal 130 may be operated without a user's involvement. For example, at least one of the terminal 120 and the terminal 130 may be a device for performing machine type communication (MTC), and may not be carried by a user. Each of the terminal 120 and the terminal 130 may be referred to as a "user equipment (UE)", a "mobile station (MS)", a "subscriber station", a "remote terminal", a "wireless terminal", a "user device", or other terms having equivalent technical meanings to those of the above-described terms, in addition the terminal.

The base station 110, the terminal 120, and the terminal 130 may transmit and receive a wireless signal in a millimeter wave (mmWave) band (e.g., 28 GHz, 30 GHz, 38 GHz, and 60 GHz). In this case, to improve a channel gain, the base station 110, the terminal 120, and the terminal 130 may perform beamforming Here, the beamforming may include transmission beamforming and reception beamforming. For example, the base station 110, the terminal 120, and the terminal 130 may assign directivity to a transmission signal and a reception signal. To this end, the base station 110 and the terminals 120 and 130 may select serving beams 112, 113, 121, and 131 through a beam search and a beam management procedure. After the serving cells 112, 113, 121, and 131 are selected, communication may be performed through resources having a quasi co-located (QCL) relationship with the resources having transmitted the serving beams 112, 113, 121, and 131.

When large-scale characteristics of a channel having transmitted symbols on a first antenna port are inferred based on a channel having transmitted symbols on a second antenna port, the first and the second antenna port may be determined to be in a QCL relationship. For example, the large-scale characteristics may include at least one of a delay spread, a Doppler spread, a Doppler shift, an average gain, an average delay, and a spatial receiver parameter.

Figure 2:
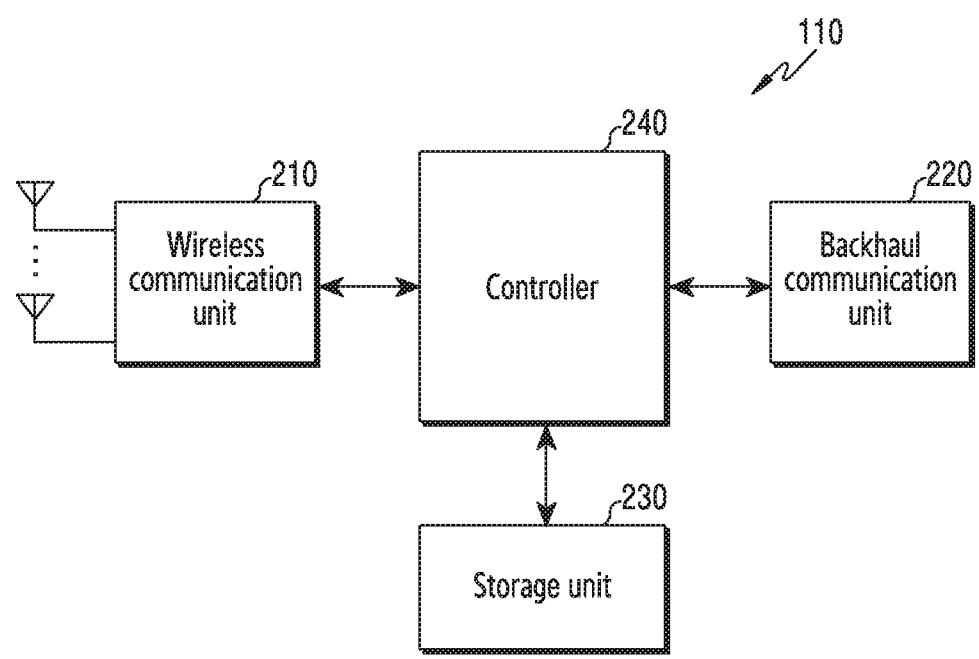
FIG. 2 illustrates a configuration of a base station in a wireless communication system according to an embodiment of the disclosure.

FIG. 2 illustrates a configuration of a base station in a wireless communication system according to an embodiment of the disclosure. The configuration illustrated in FIG. 2 may be understood as a configuration of the base station 110. The term "unit", "-or/er", or the like, to be used below may indicate a unit for processing at least one function or operation, and may be implemented by hardware, software, or a combination thereof.

Referring to FIG. 2, the base station includes a wireless communication unit 210, a backhaul communication unit 220, a storage unit 230, and a controller 240.

The wireless communication unit 210 performs functions for transmitting or receiving a signal through a wireless channel. For example, the wireless communication unit 210 may perform a function of conversion between a baseband signal and a bitstream according to a physical layer standard of the system. For example, when transmitting data, the wireless communication unit 210 may encode and modulate a transmission bitstream to generate complex symbols. In addition, when receiving data, the wireless communication unit 210 may demodulate and decode a baseband signal to restore a reception bitstream.

In addition, the wireless communication unit 210 up-converts a baseband signal into a radio frequency (RF) band signal and then transmits the RF band signal through an antenna, and down-converts an RF band signal received through an antenna into a baseband signal. To this end, the wireless communication unit 210 may include a transmission filter, a reception filter, an amplifier, a mixer, an oscillator, a digital-to-analog converter (DAC), an analog-to-digital converter (ADC), and the like. Further, the wireless communication unit 210 may also include multiple transmission/reception paths. Furthermore, the wireless communication unit 210 may include at least one antenna array including multiple antenna elements.

In terms of hardware, the wireless communication unit 210 may include a digital unit and an analog unit. The analog unit may include multiple sub-units according to operating power, operating frequency, and the like. The digital unit may be implemented by at least one processor (e.g., a digital signal processor (DSP)).

As described above, the wireless communication unit 210 transmits and receives a signal. Accordingly, some or an entirety of the wireless communication unit 210 may be referred to as a "transmitter", a "receiver", or a "transceiver". In addition, hereinafter, transmission and reception performed through a wireless channel are used to have a meaning including the processing performed by the wireless communication unit 210 as described above.

The backhaul communication unit 220 provides an interface for performing communication with other nodes in the network. For example, the backhaul communication unit 220 converts a bitstream transmitted from the base station to another node, for example, another access node, another base station, a higher node, a core network, or the like, into a physical signal, and converts a physical signal received from another node into a bitstream.

The storage unit 230 stores a basic program for operating a base station, an application program, and data, such as configuration information. The storage unit 230 may include a volatile memory, a nonvolatile memory, and a combination of the volatile memory and the nonvolatile memory. The storage unit 230 provides data stored according to a request from the controller 240.

The controller 240 controls overall operations of the base station. For example, the controller 240 may transmit and receive a signal through the wireless communication unit 210 or the backhaul communication unit 220. In addition, the controller 240 records data in the storage unit 230 and reads the recorded data therefrom. The controller 240 may perform functions of a protocol stack required by the communication standard. According to another embodiment of the disclosure, the protocol stack may be included in the wireless communication unit 210. To this end, the controller 240 may include at least one processor. According to an embodiment of the disclosure, the controller 240 may control the base station to perform operations according to an embodiment to be described below.

Figure 3:
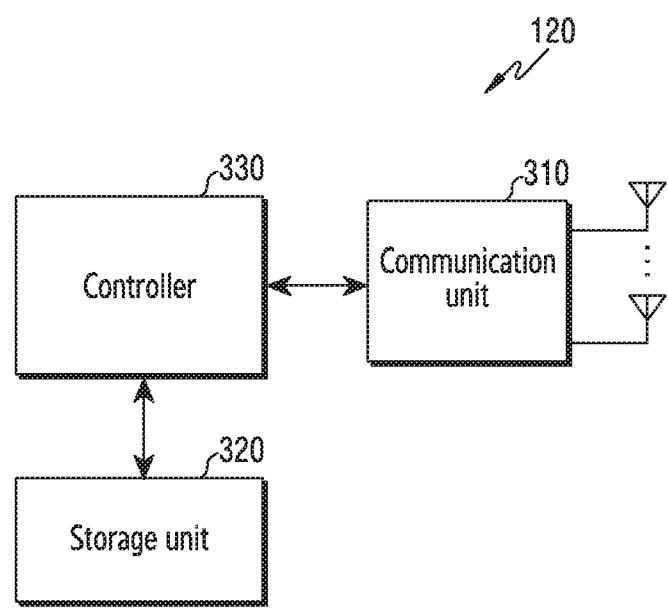
FIG. 3 illustrates a configuration of a terminal in a wireless communication system according to an embodiment of the disclosure.

FIG. 3 illustrates a configuration of a terminal in a wireless communication system according to an embodiment of the disclosure. The configuration illustrated in FIG. 3 may be understood as a configuration of the terminal 120. The term "unit", "-or/er", or the like, to be used below may indicate a unit for processing at least one function or operation, and may be implemented by hardware, software, or a combination thereof.

Referring to FIG. 3, the terminal includes a communication unit 310, a storage unit 320, and a controller 330.

The communication unit 310 performs functions for transmitting or receiving a signal through a wireless channel. For example, the communication unit 310 performs a function of conversion between a baseband signal and a bitstream according to a physical layer standard of the system. For example, when transmitting data, the communication unit 310 encodes and modulates a transmission bitstream to generate complex symbols. In addition, when receiving data, the communication unit 310 demodulates and decodes a baseband signal to restore a reception bitstream. In addition, the communication unit 310 up-converts a baseband signal into an RF base signal and then transmits the RF band signal through an antenna, and down-converts an RF base signal received through an antenna into a baseband signal. For example, the communication unit 310 may include a transmission filter, a reception filter, an amplifier, a mixer, an oscillator, a DAC, an ADC, and the like.

In addition, the communication unit 310 may include multiple transmission/reception paths. Furthermore, the communication unit 310 may include at least one antenna array including multiple antenna elements. In terms of hardware, the communication unit 310 may include a digital circuit and an analog circuit (e.g., a radio frequency integrated circuit (RFIC)). Here, the digital circuit and the analog circuit may be implemented by one package. The communication unit 310 may also include multiple RF chains. Moreover, the communication unit 310 may perform beamforming.

As described above, the communication unit 310 transmits and receives a signal. Accordingly, some or an entirety of the communication unit 310 may be referred to as a "transmitter", a "receiver", or a "transceiver". In addition, hereinafter, transmission and reception performed through a wireless channel are used to have a meaning including the processing performed by the communication unit 310 as described above.

The storage unit 320 stores a basic program for operating the terminal, an application program, and data, such as configuration information. The storage unit 320 may include a volatile memory, a nonvolatile memory, and a combination of the volatile memory and the nonvolatile memory. The storage unit 320 provides data stored according to a request from the controller 330.

The controller 330 controls overall operations of the terminal. For example, the controller 330 transmits and receives a signal through the communication unit 310. In addition, the controller 330 records data in the storage unit 320 and reads the recorded data therefrom. The controller 330 may perform functions of a protocol stack required by the communication standard. To this end, the controller 330 may include at least one processor or a micro-processor, or may be a part of a processor. Further, according to an embodiment of the disclosure, a part of the communication unit 310 and the controller 330 may be referred to as a communication processor (CP). According to various embodiments of the disclosure, the controller 330 may control the terminal to perform operations according to an embodiment to be described below.

Figure 4:
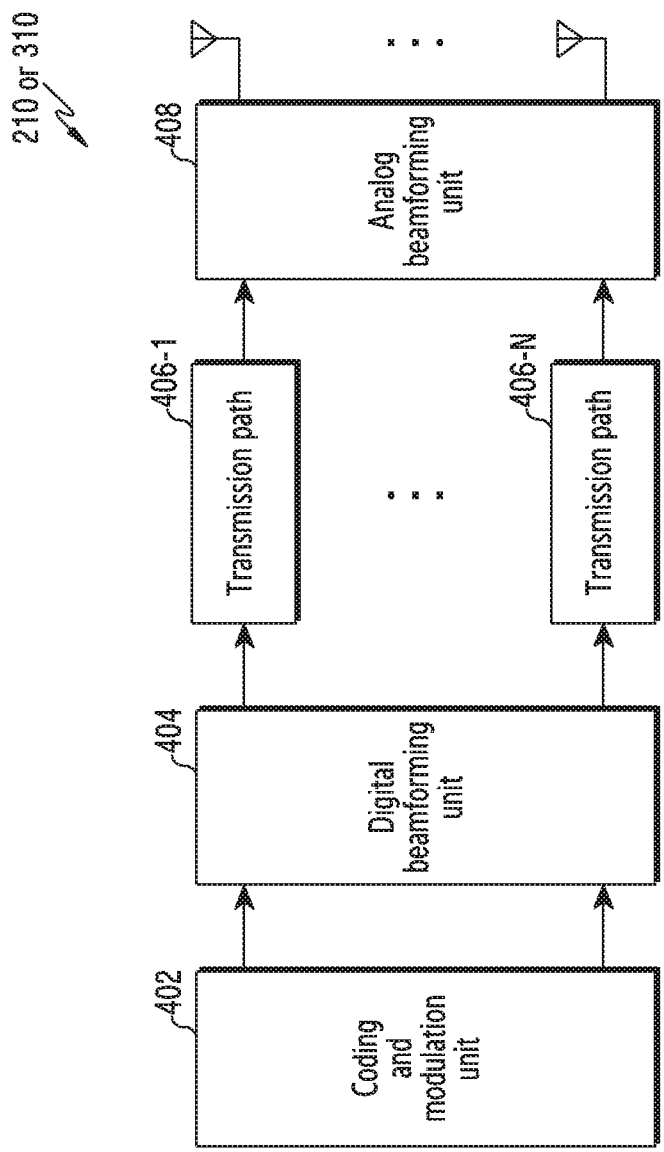
FIG. 4 illustrates a configuration of a communication unit in a wireless communication system according to an embodiment of the disclosure.

FIG. 4 illustrates a configuration of a communication unit in a wireless communication system according to an embodiment of the disclosure. FIG. 4 illustrates an example of a configuration of the wireless communication unit 210 of FIG. 2 and the communication unit 310 of FIG. 3. Specifically, FIG. 4 illustrates elements for performing beamforming as a part of the wireless communication unit 210 of FIG. 2 or the communication 310 of FIG. 3.

Referring to FIG. 4, the wireless communication unit 210 or the communication unit 310 includes a coding and modulation unit 402, a digital beamforming unit 404, multiple transmission paths 406-1 to 406-N, and an analog beamforming unit 408.

The coding and modulation unit 402 performs channel encoding. For the channel encoding, at least one of a low density parity check (LDPC) code, a convolution code, and a polar code may be used. The coding and modulation unit 402 performs constellation mapping to generate complex symbols.

The digital beamforming unit 404 performs beamforming on a digital signal (e.g., complex symbols). To this end, the digital beamforming unit 404 multiplies the modulated symbols by beamforming weights. Here, the beamforming weights are used to change the magnitude or the phase of a signal, and may be referred to as a "precoding matrix", a "precoder", and the like. The digital beamforming unit 404 outputs the modulated symbols having gone through the digital beamforming to the multiple transmission paths 406-1 to 406-N. In this case, according to a multiple-input multiple-output (MIMO) transmission technique, the modulated symbols may be multiplexed, or the same modulated symbols may be provided to the multiple transmission paths 406-1 to 406-N.

The multiple transmission paths 406-1 to 406-N convert the digital signals having gone through the digital beamforming into analog signals. To this end, each of the multiple transmission paths 406-1 to 406-N may include an inverse fast Fourier transform (IFFT) calculator, a cyclic prefix (CP) inserter, a DAC, and an up-converter. The CP inserter is used for an orthogonal frequency division multiplexing (OFDM) scheme, and may be excluded when another physical layer scheme (e.g., a filter bank multi-carrier (FBMC)) is applied. For example, the multiple transmission paths 406-1 to 406-N provide an independent signal processing process with respect to multiple streams generated by the digital beamforming. However, according to an implementation method, a part of elements of the multiple transmission paths 406-1 to 406-N may be shared.

The analog beamforming unit 408 performs beamforming on an analog signal. To this end, the analog beamforming unit 408 multiplies analog signals by beamforming weights. Here, the beamforming weights are used to change the magnitude and the phase of a signal. Specifically, according to a connection structure between the multiple transmission paths 406-1 to 406-N and antennas, the analog beamforming unit 408 may be configured in various ways. For example, each of the multiple transmission paths 406-1 to 406-N may be connected to one antenna array. For another example, the multiple transmission paths 406-1 to 406-N may be connected to one antenna array. For another example, the multiple transmission paths 406-1 to 406-N may be adaptively connected to one antenna array, or may be connected to two or more antenna arrays.

A wireless communication system deviates from the provision of the initial voice-oriented service and evolves into a wideband wireless communication system that provides a high-speed and high-quality packet data service, for example, communication standards, such as high speed packet access (HSPA), long term evolution (LTE or evolved universal terrestrial radio access (E-UTRA)), and LTE-Advanced (LTE-A) of 3GPP, high rate packet data (HRPD) and an ultra-mobile broadband (UMB) of 3GPP2, and 802.16e of IEEE. Furthermore, the communication standard of 5G or new radio (NR) is being developed as a $5^{th}$ generation wireless communication system.

A NR system adopts an orthogonal frequency division multiplexing (OFDM) scheme in a downlink (DL) and an uplink. More specifically, a cyclic-prefix OFDM (CP-OFDM) scheme has been adopted in the downlink, and a discrete Fourier transform spreading OFDM (DFT-s-OFDM) scheme has been adopted together with the CP-OFDM scheme in the uplink. The uplink indicates a wireless link through which data or a control signal is transmitted from a terminal to a base station, and the downlink indicates a wireless link through which data or a control signal is transmitted from a base station to a terminal. In a multiple-access scheme, normally, data or control information is distinguished according to a user by assigning or managing time-frequency resources for carrying data or control information of each user, wherein the time-frequency resources do not overlap, that is, orthogonality is established.

An NR system adopts a hybrid automatic repeat request (HARQ) scheme of retransmitting corresponding data in a physical layer when a decoding failure occurs in initial transmission. According to the HARQ scheme, when a receiver fails to accurately decode data, the receiver may transmit negative acknowledgement (NACK) that is information notifying of a decoding failure, to a transmitter, wherein the transmitter retransmits the corresponding data in the physical layer. The receiver may combine data retransmitted by the transmitter with data having previously failed to be decoded, thereby increasing the performance of data reception. Furthermore, when the receiver accurately decodes data, the receiver may transmit acknowledgement (ACK) that is information notifying of the successful decoding, to the transmitter, wherein the transmitter transmits new data.

Figure 5:
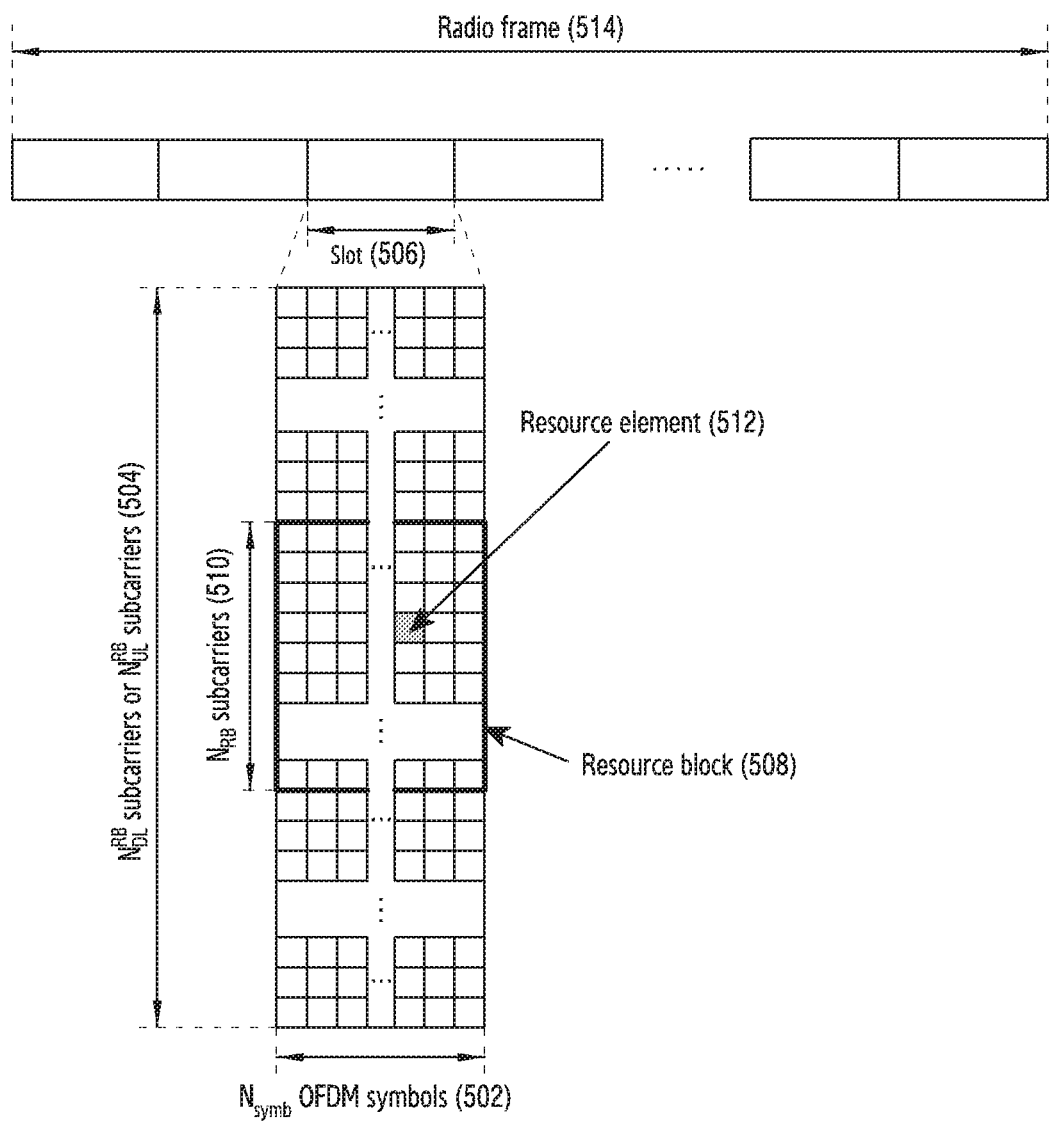
FIG. 5 illustrates a time-frequency domain resource structure in a wireless communication system according to an embodiment of the disclosure.

FIG. 5 illustrates a time-frequency domain resource structure in a wireless communication system according to an embodiment of the disclosure. FIG. 5 illustrates a basic structure of a time-frequency domain that is a wireless resource area in which data or a control channel is transmitted in the downlink and the uplink.

Referring to FIG. 5, a horizontal axis represents a time domain, and a vertical axis represents a frequency domain. In the time domain, the minimum transmission unit is an OFDM symbol, and $N_{symb}$ OFDM symbols 502 constitute one slot 506. The length of a subframe is defined as 1.0 ms, and the length of a radio frame 514 is defined as 10 ms. In the frequency domain, the minimum transmission unit is a subcarrier, and a total of $N_{BW}$ subcarriers 504 constitute the entire system transmission bandwidth.

A basic unit of a resource in the time-frequency domain is a resource element (RE) 512, and the resource element 512 may be indicated as an OFDM symbol index and a subcarrier index. A resource block (RB or a physical resource block (PRB)) 508 is defined as $N_{symb}$ consecutive OFDM symbols 502 in the time domain, and $N_{RB}$ consecutive subcarriers 510 in the frequency domain. Therefore, one RB 508 includes $N_{symb} \times N_{RB}$ REs 512. In general, the minimum transmission unit of data is RB. In the NR system, generally, $N_{symb}=14$ and $N_{RB}=12$, and $N_{BW}$ and $N_{RB}$ are proportional to a bandwidth of a system transmission band. A data rate may increase in proportion to the number of RBs which are scheduled to the terminal. In the NR system, in the case of a frequency division duplex (FDD) system in which a downlink and an uplink are distinguished by a frequency, a downlink transmission bandwidth and an uplink transmission bandwidth may be different from each other. A channel bandwidth indicates a radio frequency (RF) bandwidth corresponding to a system transmission bandwidth. Table 1 indicates a part of a corresponding relationship among a system transmission bandwidth, subcarrier spacing (SCS), and a channel bandwidth defined in an NR system in the frequency band lower than 6 GHz. Table 2 indicates a part of a corresponding relationship among a system transmission bandwidth, subcarrier spacing (SCS), and a channel bandwidth defined in an NR system in the frequency band higher than 6 GHz. For example, in an NR system having a 100 MHz channel bandwidth of 30 kHz subcarrier spacing, a transmission bandwidth includes 273 RBs. In Table 1 and Table 2, "N/A" may be a combination of a bandwidth and a subcarrier not supported in the NR system.

TABLE 1

| | Channel bandwidth [MHz] | | | | | |
|---|---|---|---|---|---|---|
| SCS | 5 | 10 | 20 | 50 | 80 | 100 |
| $N_{RB}$ constituting transmission bandwidth 15 kHz | 25 | 52 | 106 | 207 | N/A | N/A |
| 30 kHz | 11 | 24 | 51 | 133 | 217 | 273 |
| 60 kHz | N/A | 11 | 24 | 65 | 107 | 135 |

TABLE 2

| | Channel bandwidth [MHz] | | | |
|---|---|---|---|---|
| SCS | 50 | 100 | 200 | 400 |
| $N_{RB}$ constituting transmission bandwidth 60 kHz | 66 | 132 | 264 | N/A |
| 120 kHz | 32 | 66 | 132 | 264 |

In the NR system, scheduling information on downlink data or uplink data is transmitted from a base station to a terminal via downlink control information (DCI). The DCI may be defined in various formats, and whether the DCI is an uplink grant that is scheduling information on uplink data or a downlink grant that is scheduling information on downlink data, whether the DCI is compact DCI, the control information of which has a small size, whether spatial multiplexing using a multiplexing antenna is applied, whether the DCI is DCI for controlling power, and the like may be determined according to each format. For example, DCI format 1-1, which is scheduling control information on the downlink data, may include at least one of items shown in Table 3 below.

TABLE 3

| Item | Description |
|---|---|
| Carrier indicator | This indicates on which frequency carrier data is transmitted. |
| DCI format indicator | This is an indicator for indicating whether the DCI is for downlink or uplink. |
| Bandwidth part (BWP) indicator | This indicates from which BWP data is transmitted. |
| Frequency domain resource assignment | This indicates an RB of a frequency domain assigned for data transmission. A resource to be expressed is determined according to a system bandwidth and a resource assignment method. |
| Time domain resource assignment | This indicates in which OFDM symbol of which slot a data-related channel is to be transmitted. |
| VRB-to-PRB mapping | This indicates how to map a virtual RB (VRB) index and a physical RB (PRB) index. |
| Modulation and coding scheme (MCS) | This indicates a modulation scheme and a coding rate used in data transmission. In other words, a coding rate value for indicating a transport block size (TBS) and channel coding information may be indicated together with information on whether the modulation scheme is quadrature phase shift keying (QPSK), 16 quadrature amplitude modulation (16QAM), 64QAM, or 256QAM. |
| Code block group (CBG) transmission information | This indicates information on which CBG is transmitted when CBG retransmission is configured. |
| HARQ process number | This indicates a processor number of HARQ. |
| New data indicator (NDI) | This indicates whether HARQ is initial transmission or retransmission. |
| Redundancy version (RV) | This indicates a redundancy version of HARQ. |
| Transmission power control (TPC) command for physical uplink control channel (PUCCH) | This indicates a transmission power control command for a PUCCH that is an uplink control channel. |

In Table 3, in the case of PDSCH transmission, the time domain resource assignment may be expressed by information on a slot in which a PUSCH is transmitted, a start symbol position S in the corresponding slot, and the number L of symbols to which the PDSCH is mapped. Here, S may indicate a relative position from the start of the slot, L may indicate the number of consecutive symbols, and S and L may be determined by a start and length indicator value (SLIV) defined as shown in Table 4 below.

TABLE 4 if (L−1) ≤ 7 then
   SLIV=14·(L−1)+S
else
   SLIV=14·(14−L+11)+(14−1−S)
where 0<L ≤ 14−S In the NR system, in general, information on a corresponding relationship among an SLIV, a PDSCH or physical uplink shared channel (PUSCH) mapping type, and information on a slot in which the PDSCH or PUSCH is transmitted may be configured in one row via an RRC configuration. Then, the base station may transmit the SLIV value, the PDSCH or PUSCH mapping type, and the information on the slot in which the PDSCH or PUSCH is transmitted, to the terminal by indicating an index value defined in the configured corresponding relationship, using the time domain resource assignment of the DCI.

In the NR system, a PDSCH or PUSCH mapping type is defined as type A and type B. In the case of PDSCH or PUSCH mapping type A, a demodulation reference signal (DMRS) symbol starts from a second or third OFDM symbol in a slot. In the case of PDSCH or PUSCH mapping type B, the DRMS symbol starts from a first OFDM symbol in the time domain resource assigned via PUSCH transmission.

The DCI may be transmitted via a physical downlink control channel (PDCCH) that is a downlink control channel, after going through channel coding and modulation. The PDCCH may be used to refer to control information itself, not a channel. In general, the DCI is scrambled to a specific radio network temporary identifier (RNTI) or a terminal identifier independently for each terminal, and is configured and transmitted as an independent PDCCH after cyclic redundancy check (CRC) addition and channel coding. The PDCCH is mapped to a control resource set (CORESET) configured for the terminal.

The downlink data may be transmitted via a PDSCH that is a physical channel for downlink data transmission. The PDSCH may be transmitted after a control channel transmission interval, and scheduling information, such as a particular mapping position in a frequency domain, and a modulation scheme is indicated by the DCI transmitted via the PDCCH. Among the control information configuring the DCI, the base station notifies, via a MCS, the terminal of the size of data (e.g., a transport block size (TBS)) to be transmitted and a modulation scheme applied to the PDSCH to be transmitted. In an embodiment of the disclosure, the MCS may include 5 bits, or more or less than 5 bits. The TBS corresponds to a size before channel coding for error correction is applied to a transport block (TB) that is data to be transmitted by the base station.

In the disclosure, the TB may include a medium access control (MAC) header, an MAC control element (CE), one or more MAC service data units (SDUs), and padding bits. Alternatively, the TB may indicate a unit of data or a MAC protocol data unit (PDU) transmitted from an MAC layer to a physical layer.

The modulation scheme supported in the NR system is quadrature phase shift keying (QPSK), 16 quadrature amplitude modulation (QAM), 64QAM, and 256QAM, wherein modulation orders (Qm) thereof may correspond to 2, 4, 6, and 8, respectively. In other words, 2 bits per symbol for QPSK modulation, 4 bits per symbol for 16QAM, and 6 bits per symbol for 64QAM may be transmitted, and 8 bits per symbol may be transmitted for 256QAM.

Figure 6A:
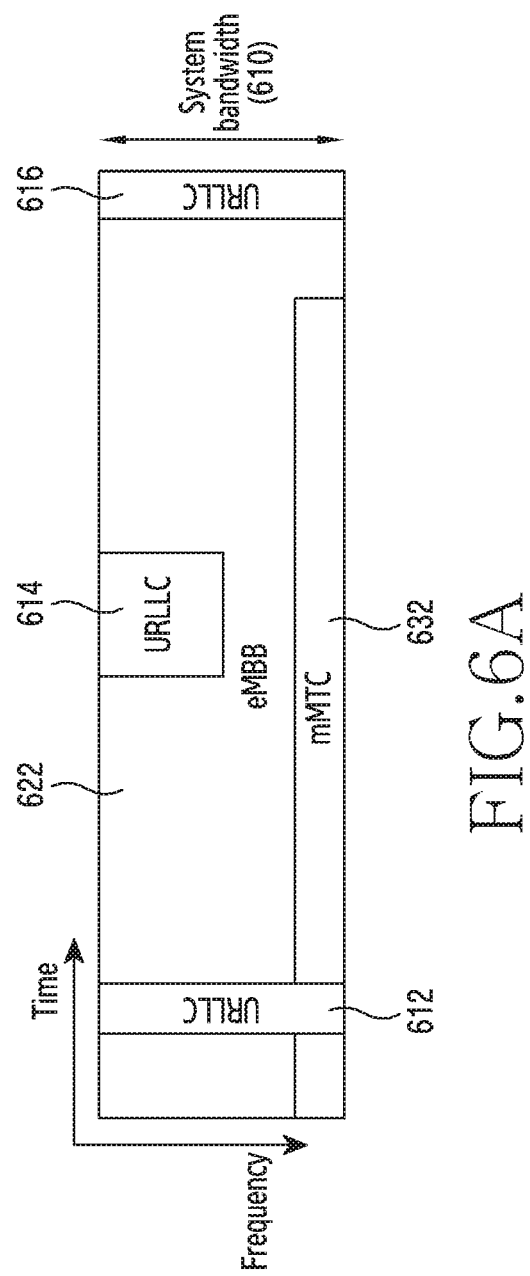
FIG. 6A illustrates an operation of assigning data according to a service to a frequency-time resource in a wireless communication system according to an embodiment of the disclosure.
Figure 6B:
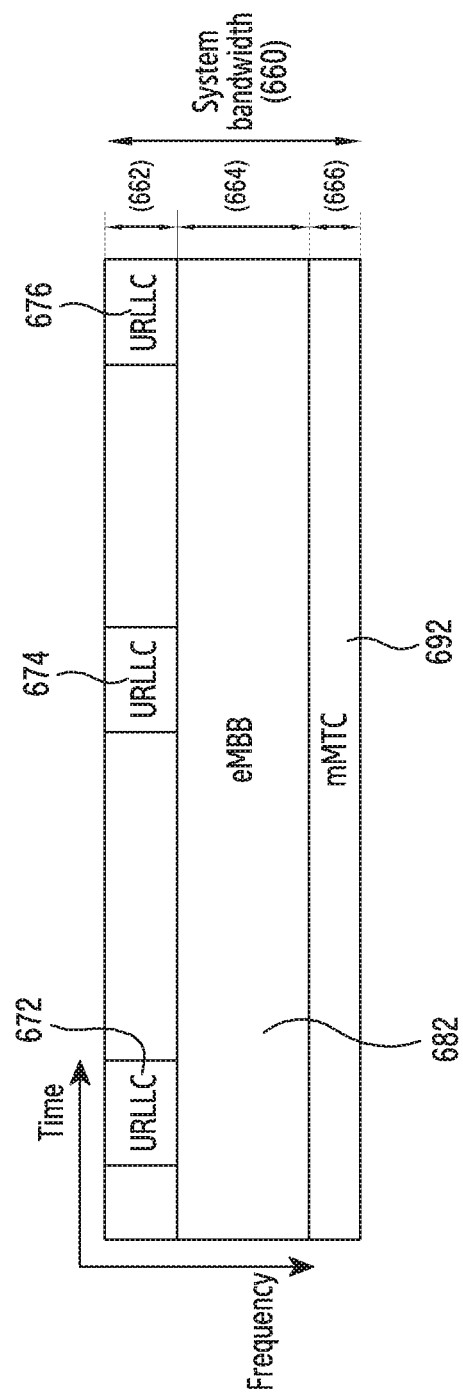
FIG. 6B illustrates an operation of assigning data according to a service to a frequency-time resource in a wireless communication system according to an embodiment of the disclosure.

In terms of a service, the NR system is designed to allow various services to be freely multiplexed in a time and frequency resource, and accordingly, waveform/numerology, a reference signal, and the like may be dynamically or freely adjusted as required. In order to provide an optimal service to the terminal in wireless communication, optimized data transmission by measuring channel quality and an interference amount is important. Therefore, accurate channel state measurement is essential. However, unlike 4G communication, in which channel and interference characteristics do not significantly change according to a frequency resource, in the case of a 5G channel, channel and interference characteristics significantly change according to a service, and thus support of a subset in the level of a frequency resource group (FRG) capable of dividing and measuring the channel and interference characteristics is required. Meanwhile, a type of service supported in the NR system may be divided into services including enhanced mobile broadband (eMBB), massive machine type communications (mMTC), and ultra-reliable and low-latency communication (URLLC). The eMBB is a service targeting high-speed data transmission of large capacity data, the mMTC is a service targeting terminal power minimization and access to multiple terminals, and the URLLC is a service targeting high reliability and low latency. Different requirements may be applied depending on the type of service applied to the terminal. An example of resource distribution for each service is as shown in FIGS. 6A and 6B below. Referring to FIGS. 6A and 6B below, a method of assigning a frequency and a time resource in each system for information transmission is identified.

FIG. 6A illustrates an example of assigning data according to a service to a frequency-time resource in a wireless communication system according to an embodiment of the disclosure.

Referring to FIG. 6A, resources are assigned for eMBB 622, URLLCs 612, 614, and 616, and mMTC 632 in an entire system frequency bandwidth 610. When URLLC data 612, 614, and 616 is generated while eMBB data 622 and mMTC data 632 are assigned to a specific frequency band and transmitted, an area to which the eMBB 622 and the mMTC 632 are already assigned may be emptied or the eMBB 622 and the mMTC 632 may be not be transmitted, and URLLC data 612, 614, and 616 may be transmitted. Since the URLLC requires reduction of a delay time, a resource for transmitting the URLLC data 612, 614, and 616 may be assigned to a part of a resource to which the eMBB 622 is assigned. When the URLLC 612, 614, and 616 is additionally assigned to a resource, to which the eMBB 622 is assigned, and transmitted, the eMBB data 622 may not be transmitted in overlapping time-frequency resources. Accordingly, the transmission performance of the eMBB data 622 may decrease. In other words, in the above case, a transmission failure of the eMBB 622 data may occur due to assignment of a resource for the URLLC 612, 614, and 616. The method as shown in FIG. 6A may be referred to as a "preemption" method.

FIG. 6B illustrates another example of assigning data according to a service to a frequency-time resource in a wireless communication system according to an embodiment of the disclosure.

Referring to FIG. 6B, it illustrates an example of providing each service in each of sub-bands 662, 664, and 666 obtained by dividing an entire system frequency band 660. Specifically, a sub-band 662 is used for transmitting URLLC data 672, 674, and 676, a sub-band 664 is used for transmitting eMBB data 682, and a sub-band 666 is used for transmitting mMTC data 692. Information relating to a configuration of sub-bands 662, 664, and 666 may be pre-determined, and the information may be transmitted from a base station to a terminal via higher signaling. Alternatively, the base station or a network node may arbitrarily divide information relating to sub-bands 662, 664, and 666 and provide services without separately transmitting sub-band configuration information to the terminal.

In an embodiment of the disclosure, the length of a transmission time interval (TTI) used for URLLC transmission may be shorter than the length of a TTI used for eMBB or mMTC transmission. Further, a response to information relating to the URLLC may be transmitted faster than that of the eMBB or mMTC, and accordingly, the terminal using URLLC service may transmit or receive information with low latency. Structures of a physical layer channel, which are used for respective types to transmit the above three types of services or data, may differ from each other. For example, at least one of the length of a TTI, an assignment unit of a frequency resource, a structure of a control channel, and a method of mapping data may differ from one another.

Three types of services and three types of data have been described, but there may be more types of services and data corresponding to the services, and in this case, an embodiment to be described below may also be applied thereto.

Figure 7:
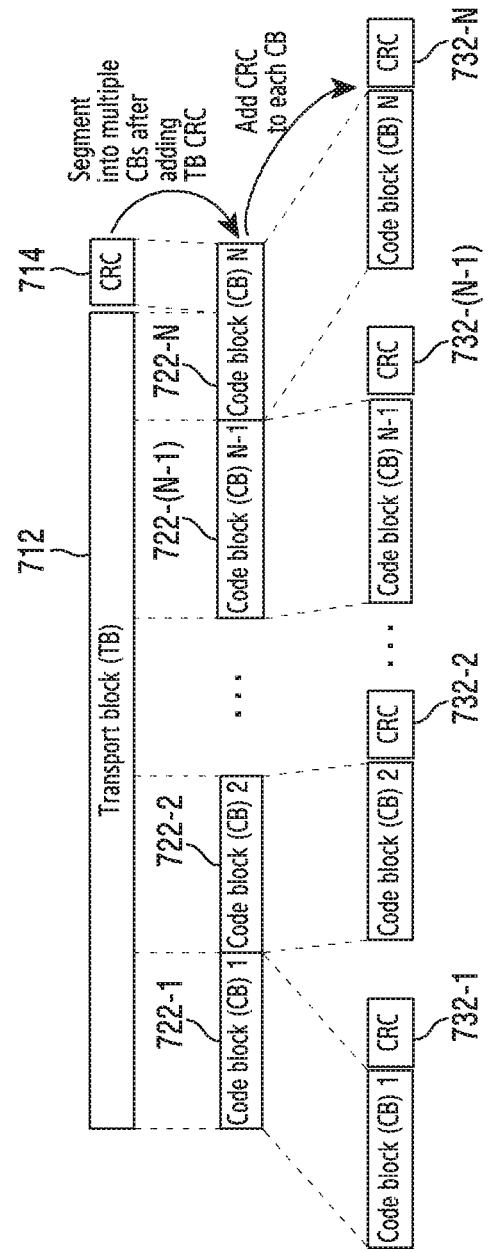
FIG. 7 illustrates a method of encoding data in a wireless communication system according to an embodiment of the disclosure.

FIG. 7 illustrates a method of encoding data in a wireless communication system according to an embodiment of the disclosure. FIG. 7 illustrates an example in which one TB is segmented into multiple codeblocks (CBs), and CRC is added thereto.

Referring to FIG. 7, the CRC 714 may be added at the front or back of one TB 712 to be transmitted in an uplink or a downlink. The CRC 714 may have 16 bits, 24 bits, or a pre-fixed number of bits, or may have a bit number variable depending on a channel state, and may be used for determining whether channel coding is successful in a receiver. The TB 712 and a block to which the CRC 714 is added are divided into a plurality of CBs 722-1, 722-2, 722-(N−1), and 722-N. The TB 712 and a block to which the CRC 714 is added may be divided into pre-defined sizes of the CBs, and in this case, the last CB 722-N may be configured to have a size smaller than the other CBs, or to have the same length as the other CBs by adding 0, a random value, or 1. CRCs 732-1, 732-2, 732-(N−1), and 732-N may be added to the segmented CBs, respectively. Each of the CRCs 732-1, 732-2, 732-(N−1), and 732-N may have 16 bits, 24 bits, or a pre-fixed number of bits, and may be used for determining whether channel coding is successful in a receiver.

In order to generate the CRC 714, the TB 712 and a cyclic generator polynomial may be used. The cyclic generator polynomial may be defined in various ways. For example, when the cyclic generator polynomial for a 24-bit CRC is $g_{CRC24A}(D)=D^{24}+D^{23}+D^{18}+D^{17}+D^{14}+D^{11}+D^{10}+D^7+D^6+D^5+D^4+D^3+D+1$, and L=24, CRC $p_1, p_2, \ldots, p_{L-1}$ may be determined to be a value obtained by dividing $a_0 D^{A+23}+a_1 D^{A+22}+\ldots+a_{A-1}D^{24}+p_0 D^{23}+p_1 D^{22}+\ldots+p_{22}D^1+p_{23}$ by $g_{CRC24A}(D)$ with the remainder of 0 with respect to TB data $a_0, a_1, a_2, a_3, \ldots, a_{A-1}$. In the above-described example, although the CRC length L is described to be 24, the length L may be variously defined as 12, 16, 24, 32, 40, 48, 64, and the like.

As described above, after adding the CRC to the TB, the sum of TB and CRC is divided into N number of CBs 722-1, 722-2, 722-(N−1), and 722-N. The CRCs 732-1, 732-2, 732-(N−1), and 732-N are added to CBs 722-1, 722-2, 722-(N−1), 722-N, respectively. The CRC added to each CB may be generated based on a CRC having a length different from that of the CRC added to the TB, or on a different cyclic generator polynomial from that used when generating the CRC added to the TB. However, according to another embodiment of the disclosure, the CRC 714 added to the TB and the CRCs 732-1, 732-2, 732-(N−1), and 732-N added to CBs 722-1, 722-2, 722-(N−1), and 722-N may be omitted according to a type of channel code to be applied to a CB. For example, when a low density parity check (LDPC) code is applied to a CB instead of a turbo code, the CRCs 732-1, 732-2, 732-(N−1), and 732-N, which are added to CBs, respectively, may be omitted. However, even when the LDPC code is applied, the CRCs 732-1, 732-2, 732-(N−1), and 732-N may be added to the CBs 722-1, 722-2, 722-(N−1), and 722-N. Further, when a polar code is used, the CRC may be also added or omitted.

As shown in FIG. 7, in a TB, the maximum length of one CB is determined based on a type of channel coding to be applied, and a TB and a CRC added to the TB are segmented into CBs according to the maximum length of the CB. In a LTE system of the related, a CRC for a CB is added to the segmented CB, a data bit of the CB and the CRC are encoded into a channel code to determine coded bits, and, for each of the coded bits, the number of bits to be rate-matched is determined as promised in advance.

Figure 8:
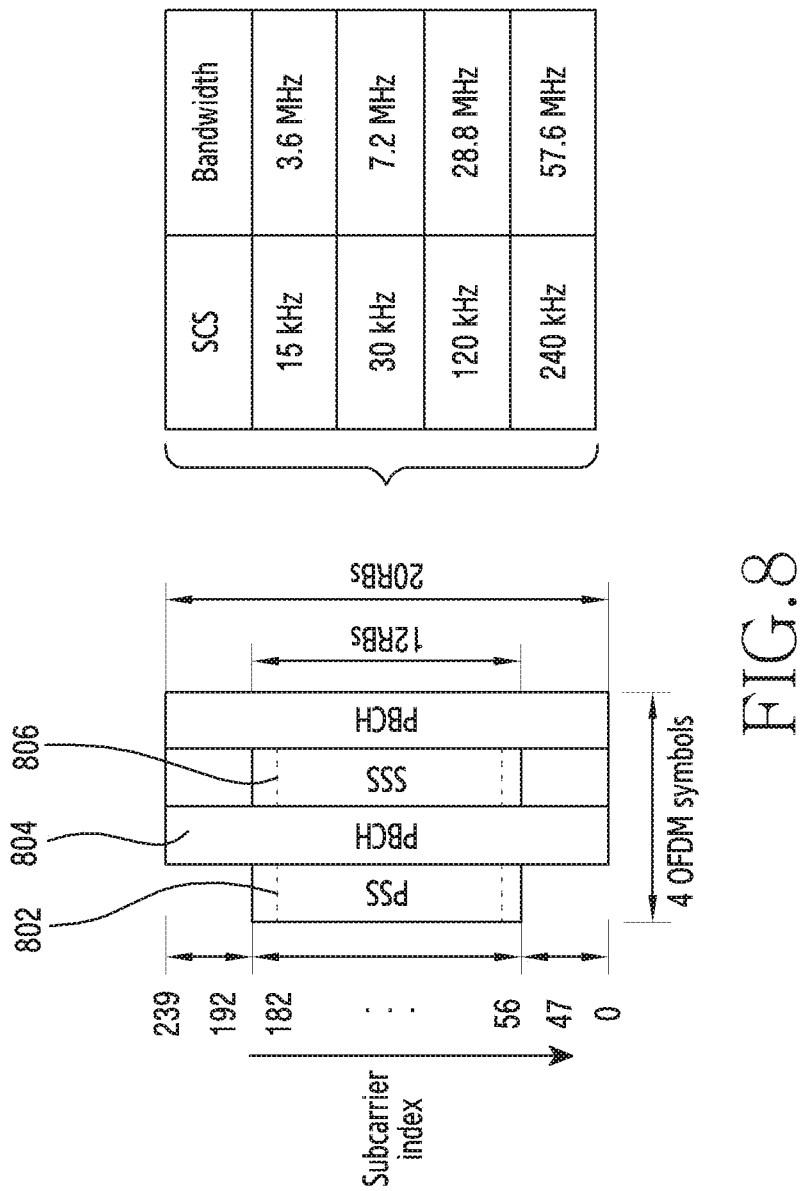
FIG. 8 illustrates mapping of a synchronization signal and a broadcast channel in a wireless communication system according to an embodiment of the disclosure.

FIG. 8 illustrates mapping of a synchronization signal and a broadcast channel in a wireless communication system according to an embodiment of the disclosure.

Referring to FIG. 8 illustrates an example of a result of mapping of synchronization signals and a physical broadcast channel (PBCH) to a frequency and time domain in a 3GPP NR system. A primary synchronization signal (PSS) 802, a secondary synchronization signal (SSS) 806, and a PBCH 804 are mapped over 4 OFDM symbols, the PSS 802 and the SSS 806 are mapped to 12 RBs, and the PBCH 804 is mapped to 20 RBs. FIG. 8 illustrates frequency bandwidths of 20 RBs according to subcarrier spacing (SCS). A set of the PSS 802, the SSS 806, and the PBCH 804, or a resource area for transmitting the PSS 802, the SSS 806, and the PBCH 804 may be referred to as a SS/PBCH block (SS block, or SSB).

Figure 9:
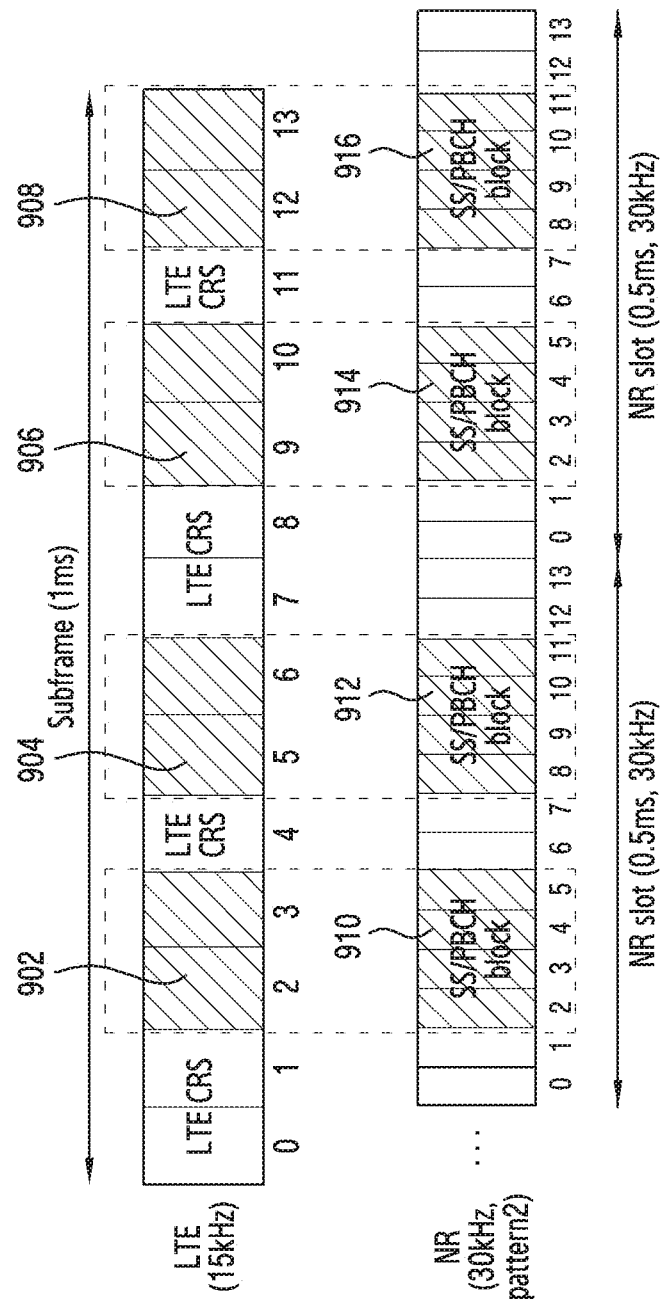
FIG. 9 illustrates an operation of allocating a synchronization signal/physical broadcast channel block (SSB) in a wireless communication system according to an embodiment of the disclosure.

FIG. 9 illustrates an example of allocating a SSB in a wireless communication system according to an embodiment of the disclosure. FIG. 9 is an example of illustrating to which symbols one SSB is mapped in a slot, and illustrates an LTE system employing 15 kHz subcarrier spacing, and an NR system employing 30 kHz subcarrier spacing.

Referring to FIG. 9, SSBs 910, 912, 914, and 916 in the NR system are transmitted at positions 902, 904, 906, and 908 in which the SSBs do not overlap with cell-specific reference signals (CRSs) transmitted always in the LTE system. The design as shown in FIG. 9 may be for allowing the LTE system and the NR system to coexist in one frequency band.

Figure 10A:
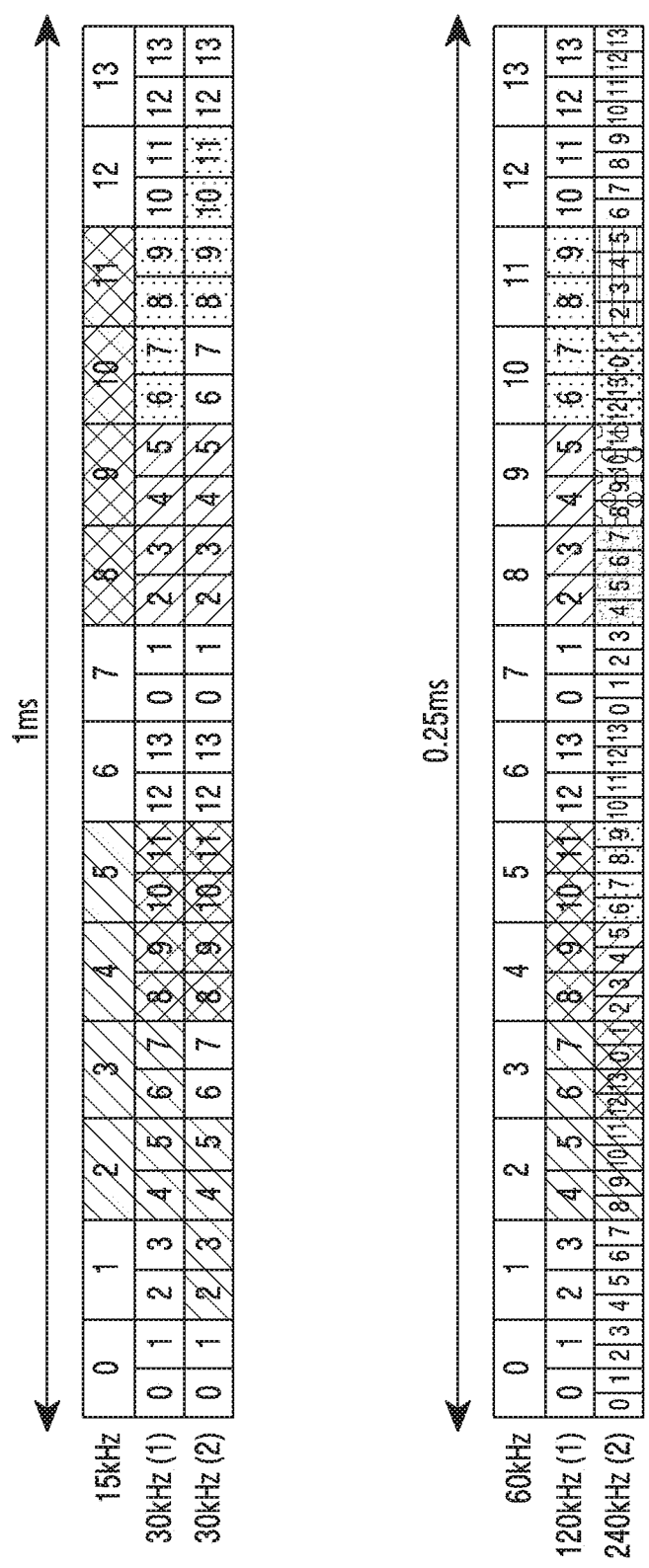
FIG. 10A illustrates symbol positions, in which an SSB is transmittable, according to subcarrier spacing in a wireless communication system according to an embodiment of the disclosure.
Figure 10B:
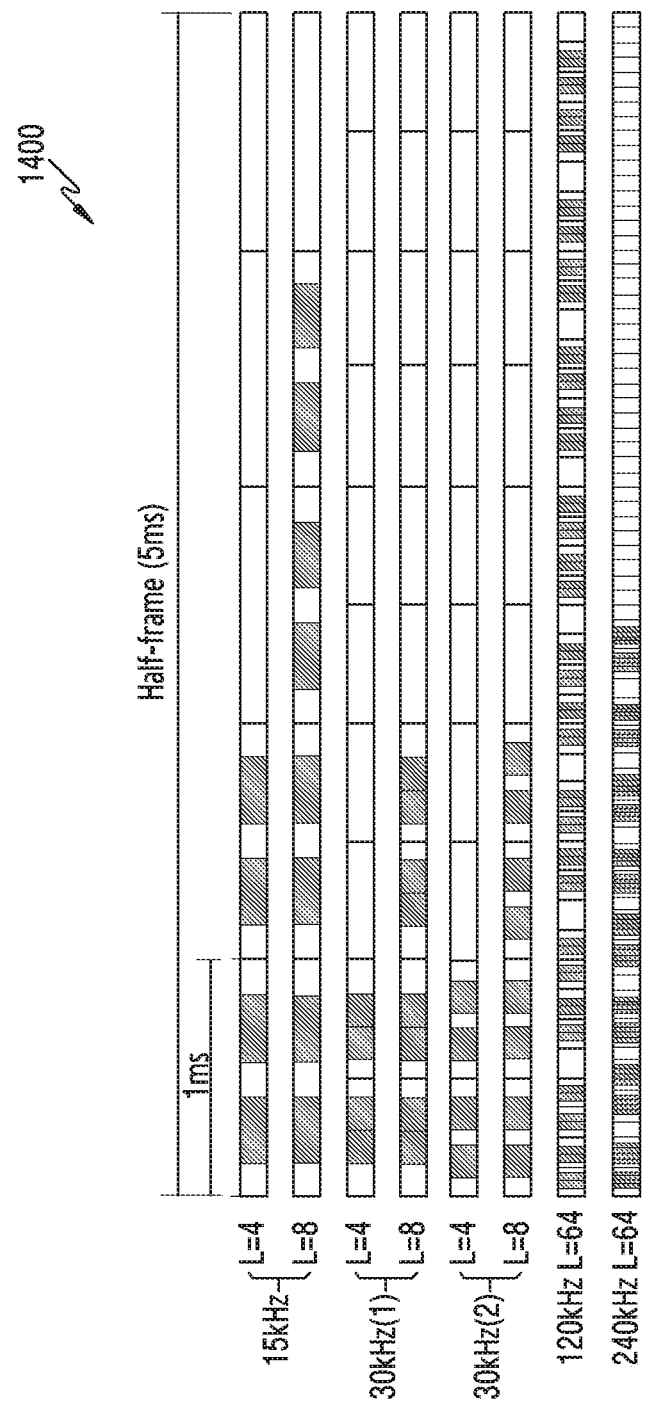
FIG. 10B illustrates symbol positions, in which an SSB is transmittable, according to subcarrier spacing in a wireless communication system according to an embodiment of the disclosure.

FIG. 10A illustrates symbol positions, in which an SSB is transmittable, according to subcarrier spacing in a wireless communication system according to an embodiment of the disclosure, and FIG. 10B illustrates symbol positions, in which an SSB is transmittable, according to subcarrier spacing in a wireless communication system according to an embodiment of the disclosure. FIG. 10A illustrates symbol positions in which an SSB is transmittable in an interval of 1 ms, and FIG. 10B illustrates symbol positions in which an SSB is transmittable in an interval of 5 ms.

Referring to FIGS. 10A and 10B, in an area 1400 in which an SSB is transmittable, the SSB is not always to be transmitted, and the SSB may be transmitted or may not be transmitted upon the selection of a base station.

A terminal amplifies a received signal. The strength of a signal and a dynamic range of an amplifier provided at the terminal may determine an amplification degree. The dynamic range indicates a range of strength of a signal in which an input and an output of the amplifier has a linear relationship. If the input and the output of the amplifier is not in a linear relationship, and the phase of the signal is arbitrarily changes, the corresponding signal may not be used for data demodulation or decoding. However, when the intended amplification degree is excessively large, not only the signal may be amplified to have the strength not greater than a certain strength, but also the phase thereof arbitrarily changes, and thus the terminal may not arbitrarily amplify the received signal to have large strength. Further, when the amplification degree is too small, deterioration in the performance of data reception may occur. Therefore, the terminal is required to amplify a received signal to appropriate strength. Therefore, when the terminal performs amplification, it may be important to identify the strength of a received signal. For example, when the strength of the received signal is too large, the amplification degree is to be decreased, and when the strength of the received signal is too small, the amplification degree is to be increased. As described above, the terminal is required to change the amplification degree according to the strength of a received signal, and this operation is referred to as "AGC".

Figure 11:
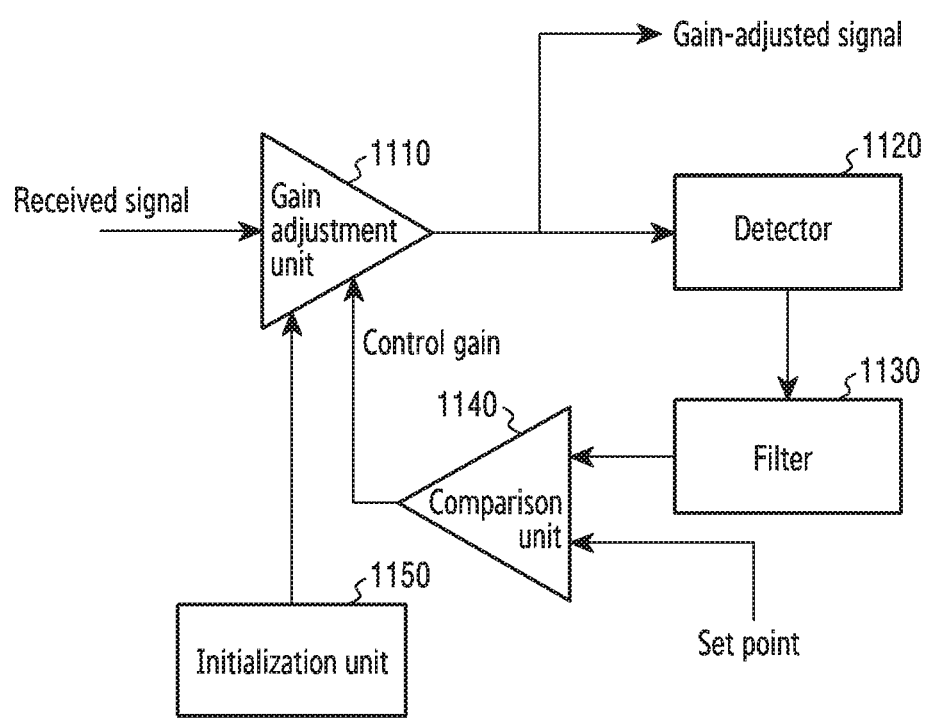
FIG. 11 illustrates a configuration of a circuit for adjusting a gain of a received signal in a wireless communication system according to an embodiment of the disclosure.

FIG. 11 illustrates a configuration of a circuit for adjusting a gain of a received signal in a wireless communication system according to an embodiment of the disclosure. FIG. 11 is an example of a circuit for performing an AGC operation, and may be understood to be a part of the communication unit 310 of FIG. 3.

Referring to FIG. 11, the circuit includes a gain adjustment unit 1110, a detector 1120, a filter 1130, a comparison unit 1140, and an initialization unit 1150.

The gain adjustment unit 1110 adjusts a gain of a received signal. Adjusting a gain includes an operation of increasing power of the received signal. The signal received as an input into the again adjustment unit 1110 may be an RF signal, an IF signal, or a baseband signal according to a specific embodiment. For example, the gain adjustment unit 1110 may include a variable gain amplifier (VGA). In other words, the gain adjustment unit 1110 may amplify power of the received signal. The amplified signal may be referred to as a gain-adjusted signal, and may be transmitted to another circuit for a subsequent process (e.g., demodulation and decoding). Further, the gain-adjusted signal is provided to the detector 1120.

The detector 1120 detects a size or strength of the gain-adjusted signal. For example, the detector 1120 estimates the size of the amplified signal. The value of the size may be expressed in one form of an envelope value, a root mean square (RMS) value, and a log value of the gain-adjusted signal. The size of the gain-adjusted signal is filtered (e.g., low-band filtered, high-band filtered, or band-passing filtered) by the filter 1130. According to another embodiment of the disclosure, the filter 1130 may be omitted. Then, the filtered signal is input into the comparison unit 1140. The comparison unit 1140 compares the filtered signal and reference value (e.g., a set point). The comparison unit 1140 compares the estimated size and the reference value and outputs a gain control signal corresponding to a value of a difference between the size and the reference value. Here, the reference value is determined by a dynamic range of an amplifier of a terminal. The comparison 1140 may be referred to as an "error amplifier".

The gain control signal is received as an input, i.e., feedback, to the gain adjustment unit 1110, and changes the amplification degree of the gain adjustment unit 1110. In other words, the gain adjustment unit 1110 determines the amplification degree, i.e., a gain value, based on the gain control signal. The amplification degree of the gain adjustment unit 1110 is determined according to a difference between the estimated amplification strength and the reference value, and the amplification degree may be determined, wherein the size of the amplified signal is to be included in the dynamic range of the amplifier of the terminal.

A gain value of the gain adjustment unit 1110 is adjusted based on the above-described loop by the gain adjustment unit 1110, the detector 1120, the filter 1130, and the comparison unit 1140, wherein the size of the amplified signal corresponds to or is similar to the reference value. In this case, the state in which the size of the amplified signal corresponds to or is similar to the reference value is referred to as a "settled state", and the time required to be in the settled state is referred to as "AGC settling time" or "settling time".

The initialization unit 1150 provides an initial amplification degree, i.e., an initial value, of the gain adjustment unit 1110. By appropriately determining the initial value, the settling time may be reduced. The initial value may be referred to as a "start gain value", an "initial gain value", or other terms having equivalent technical meanings to those of the above-described terms. The initial value indicates a gain value at the time of starting an AGC operation after receiving a signal, or may be a parameter relating thereto. When the initial value is already similar to the settled value at the time of performing the AGC operation, the settling time may be largely reduced, which indicates that AGC is efficient.

As described with reference to FIG. 11, the circuit for performing the AGC operation according to an embodiment includes the initialization unit 1150 for providing the initial value. By the initialization unit 1150, the settling time may be reduced. In order to effectively reduce the settling time, a method of appropriately determining the initial value is required. Before describing embodiments of determining the initial value, technical advantages of using the initial value will be described with reference to FIGS. 12A and 12B below.

Figure 12A:
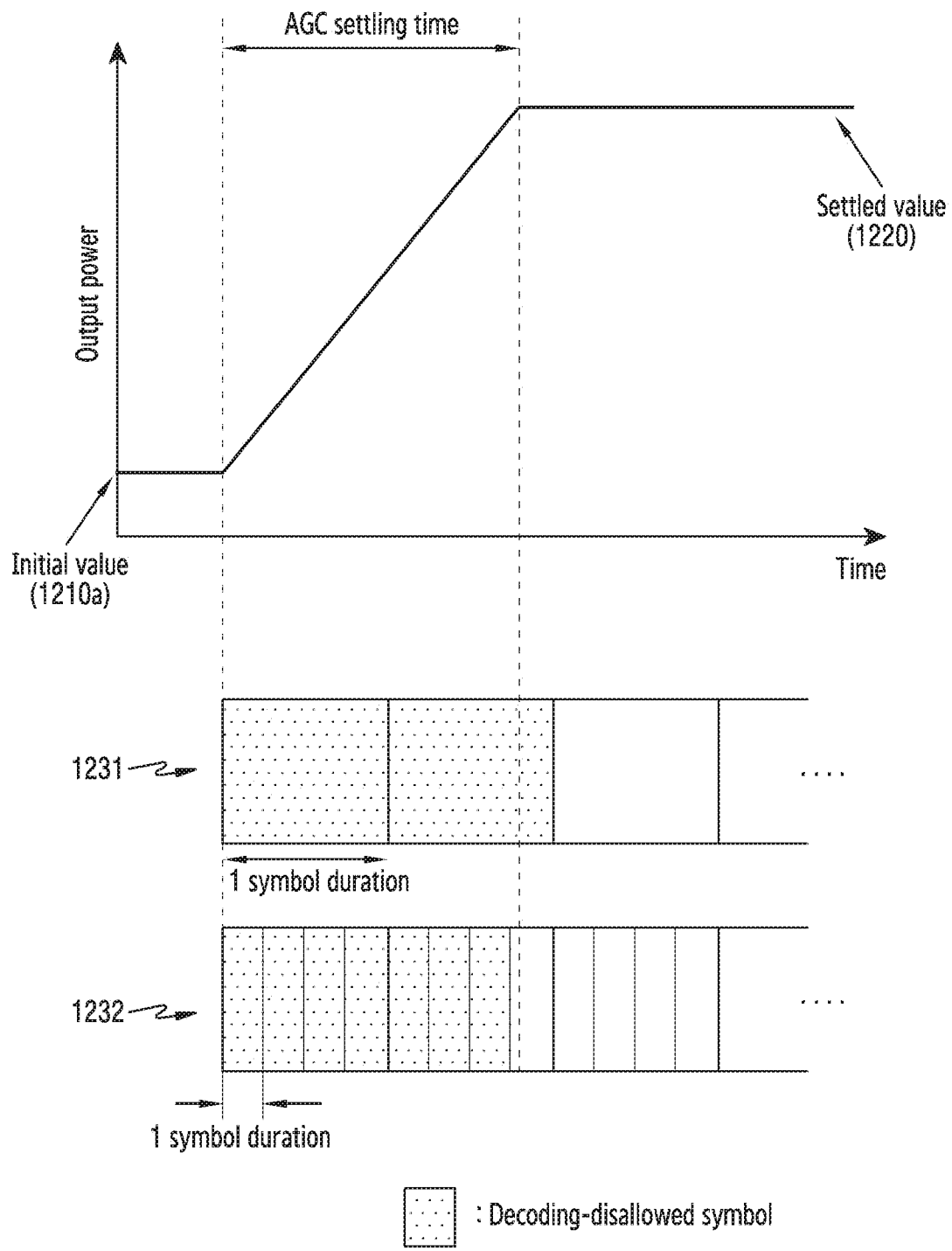
FIG. 12A illustrates a change in a gain of a received signal in the case where an initial value is not used in a wireless communication system according to an embodiment of the disclosure.

FIG. 12A illustrates a change in a gain of a received signal in the case where an initial value is not used in a wireless communication system according to an embodiment of the disclosure.

Referring to FIG. 12A, it illustrates a change over time in the size of a signal according to an AGC operation at the time of receiving symbols of CP-OFDM or DFT-s-OFDM. When the signal is received, the terminal performs the AGC operation, and after a settling time or a training time passes, a settled value 1220 is acquired. However, since gains of the signals received during the settling time are not constant, and the phases of the signals change, the signals may not be used for decoding. In this case, an amount of data or a control signal which is unusable for decoding may differ depending on the length of one OFDM symbol duration. For example, in a first case 1231, signals corresponding to about 2 symbol durations may not be used for decoding of data or a control signal. For another example, in a second case 1232, signals corresponding to about 7 symbol durations may not be used for decoding of data or a control signal.

Figure 12B:
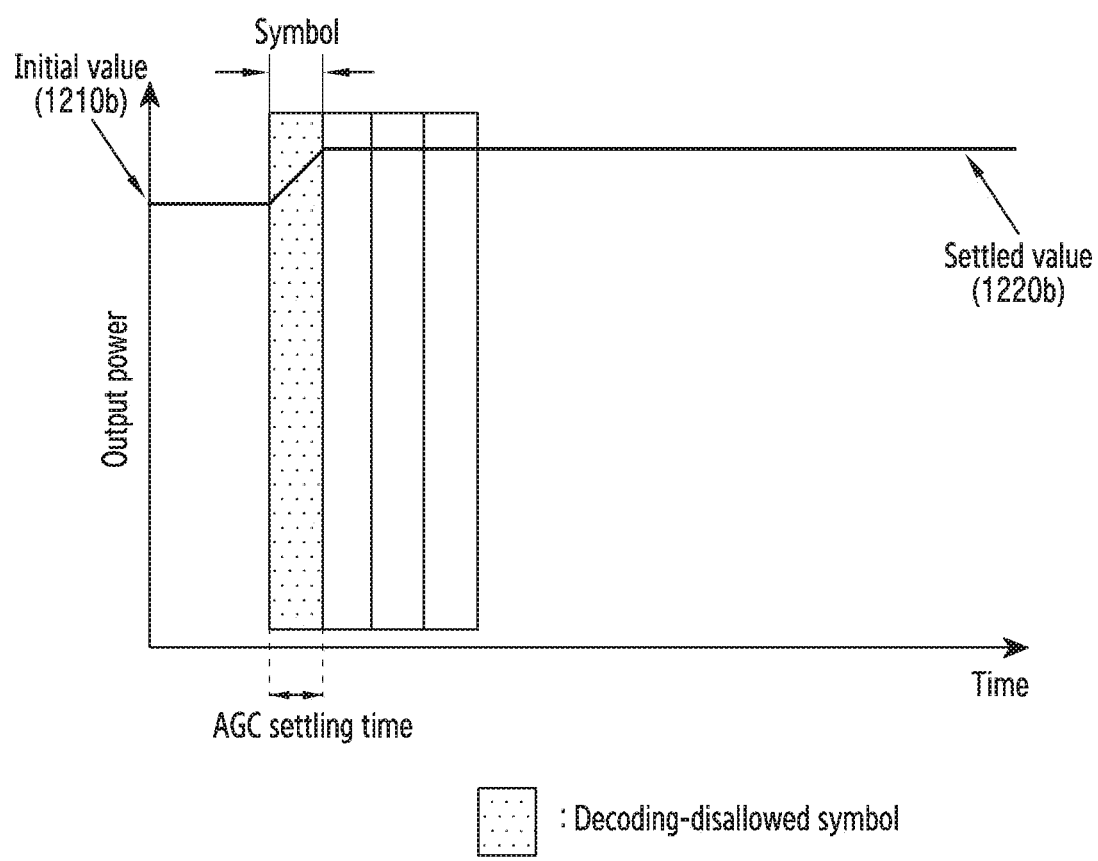
FIG. 12B illustrates a change in a gain of a received signal in the case where an initial value is used in a wireless communication system according to an embodiment of the disclosure.

FIG. 12B illustrates a change in a gain of a received signal in the case where an initial value is used in a wireless communication system according to an embodiment of the disclosure.

Referring to FIG. 12B, an initial value 1210*b* more similar to a settled value 1220*b* than the initial value of FIG. 12A is used. Accordingly, very short settling time is required in FIG. 12B compared to FIG. 12A.

Figure 13:
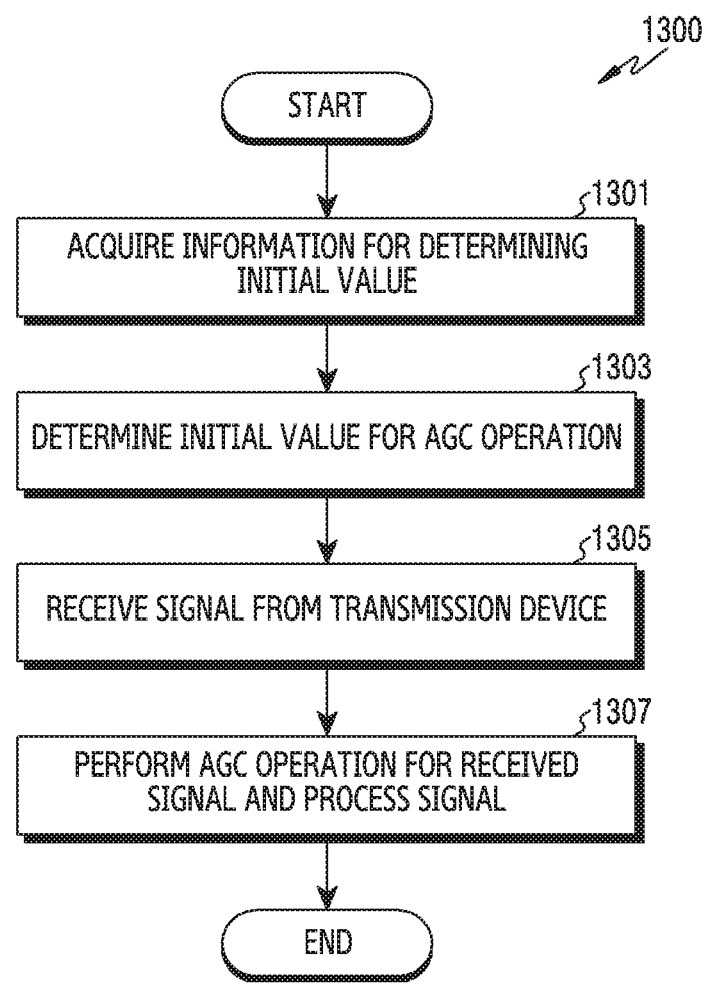
FIG. 13 illustrates a flowchart of receiving a signal by a terminal in a wireless communication system according to an embodiment of the disclosure.

FIG. 13 illustrates a flowchart 1300 of receiving a signal by a terminal in a wireless communication system according to an embodiment of the disclosure. FIG. 13 illustrates an operation method of a terminal 120 or a terminal 130.

Referring to FIG. 13, at operation 1301, the terminal acquires information for determining an initial value. The initial value is a gain value of an VGA at the time of performing an AGC operation, and may be determined based on various pieces of information. According to an embodiment of the disclosure, information for configuring an initial value is information relating to a counterpart device (e.g., another terminal or another base station) for transmitting a signal. For example, the information may include at least one of identification information of the counterpart device, information on a channel established with the counterpart device, information on a resource used by the counterpart device to transmit a signal, information on a signal previously transmitted by the counterpart device, and information on an operation state of the terminal at the time of previously receiving a signal from the counterpart device.

At operation 1303, the terminal determines an initial value for performing the AGC operation. In other words, the terminal determines the initial value based on the acquired information, and applies the determined initial value to the VGA. The terminal determines and applies a gain value of the VGA, which is to be applied at the time of starting receiving the signal. The configuration of the initial value may be completed before the received signal is input to the AGC circuit.

At operation 1305, the terminal receives a signal from a transmission device. The received signal may include data or control information. The signal is received through an antenna, and is received as an input into a circuit for the AGC operation. For example, the signal is received as an input into the VGA. Here, the signal received as an input into the VGA may be an RF signal, an IF signal, or a baseband signal.

At operation 1307, the terminal performs the AGC operation for the received signal, and processes the gain-adjusted signal. After applying the initial value, the terminal performs the AGC operation. The signal, the gain of which is adjusted upon the AGC operation, is then used for demodulation and decoding. In this case, according an embodiment of the disclosure, the signal received during a settling time of the AGC operation may not be used for demodulation and decoding. According to another embodiment of the disclosure, the signal received during the settling time may be used for demodulation and decoding after going through compensation for the size and the phase thereof. Here, the size and the phase to be compensated may be determined based on the initial value, the settled value, and the settling time.

The above-described embodiments of controlling a gain of a received signal may be applied to various environments. For example, in an environment in which an entity of transmitting signals received by the terminal may change, the above-described AGC operation may be performed. For example, in a vehicle-to-everything (V2X) communication environment, a signal is transmitted and received based on device-to-device (D2D) communication. Accordingly, it is possible that a strength of the received signal may largely change. Hereinafter, embodiments of performing the AGC operation in the V2X environment will be described.

In embodiments to be described below, a base station is an entity for performing resource assignment of a terminal, and may be a base station supporting both V2X communication and normal cellular communication, or a base station supporting only V2X communication. In other words, the base station may indicate a gNB, an eNB, or a road site unit (RSU) or a fixed station. The terminal may be not only a normal UE and a mobile station, but also one of a vehicle supporting vehicular-to-vehicular (V2V) communication, a vehicle or a handset (e.g., a smartphone) of a pedestrian supporting vehicular-to-pedestrian (V2P) communication, a vehicle supporting vehicular-to-network (V2N) communication, or a vehicle supporting vehicular-to-infrastructure (V2I) communication, and an RSU equipped with a terminal function, an RSU equipped with a base station function, or an RSU equipped with a part of a base station function and a part of a terminal function.

In the V2X environment, data may be transmitted from one terminal to a plurality of terminals, from one terminal to another terminal, or from one base station to a plurality of terminals. However, the disclosure is not limited thereto, and may be applied to various cases.

Figure 14A:
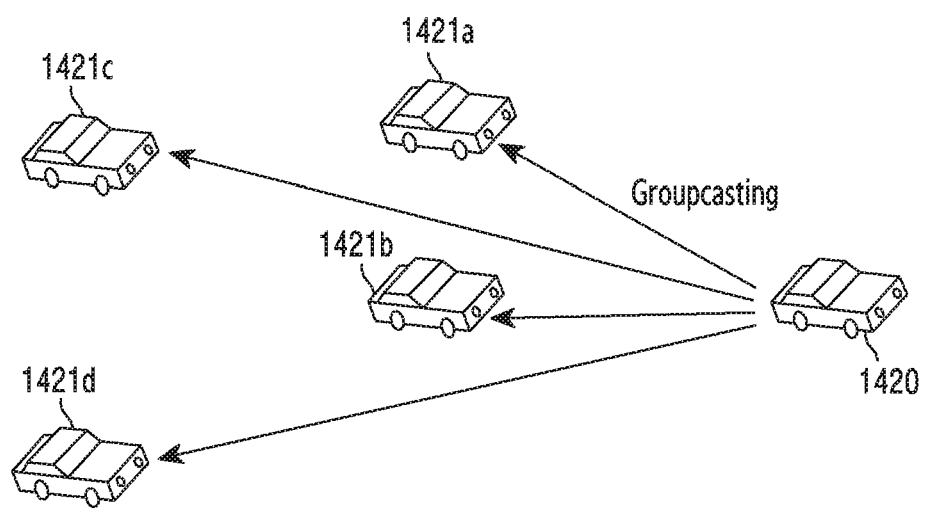
FIG. 14A illustrates an operation of groupcasting transmission in a wireless communication system according to an embodiment of the disclosure.

FIG. 14A illustrates an example of groupcasting transmission in a wireless communication system according to an embodiment of the disclosure.

Referring to 14A, a terminal 1420 transmits common data to a plurality of terminals 1421*a*, 1421*b*, 1421*c*, and 1421*d*, that is, transmits data in a groupcasting manner. The terminal 1420 and each of the terminals 1421*a*, 1421*b*, 1421*c*, and 1421*d* may be a mobile device, such as a vehicle. For the groupcasting, at least one piece of separate control information (e.g., sidelink control information (SCI)), physical control channel (e.g., a physical sidelink control channel (PSCCH)), and data may be further transmitted.

Figure 14B:
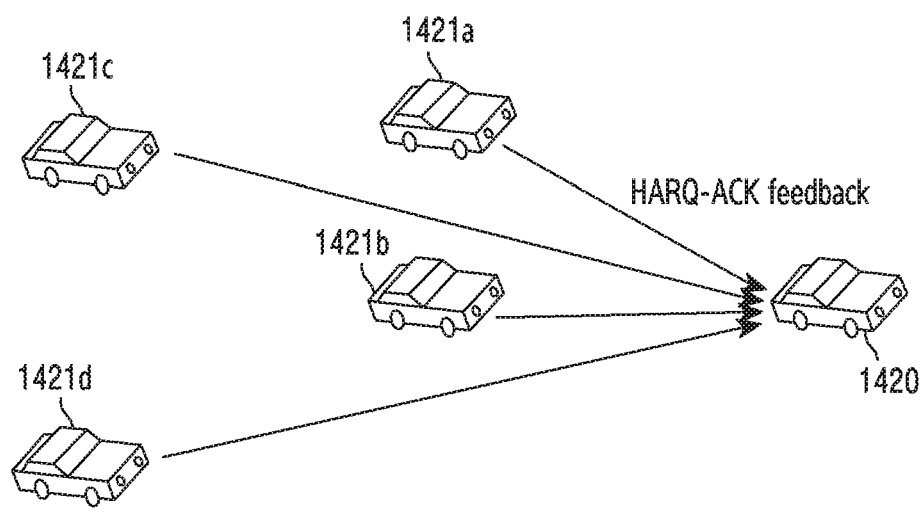
FIG. 14B illustrates an operation of hybrid automatic repeat request (HARQ) feedback transmission according to groupcasting in a wireless communication system according to an embodiment of the disclosure.

FIG. 14B illustrates an example of HARQ feedback transmission according to groupcasting in a wireless communication system according to an embodiment of the disclosure.

Referring to FIG. 14B, terminals 1421*a*, 1421*b*, 1421*c*, and 1421*d*, which have received common data by groupcasting, transmit information indicating success of failure of data reception to a terminal 1420 which has transmitted the data. The information may include HARQ-ACK feedback. The data transmission and feedback operations as shown in FIGS. 14A and 14B are performed based on the groupcasting. However, according to another embodiment of the disclosure, the data transmission and feedback operations manner as shown in FIGS. 14A and 14B may be applied to transmission performed in a unicasting.

Figure 15:
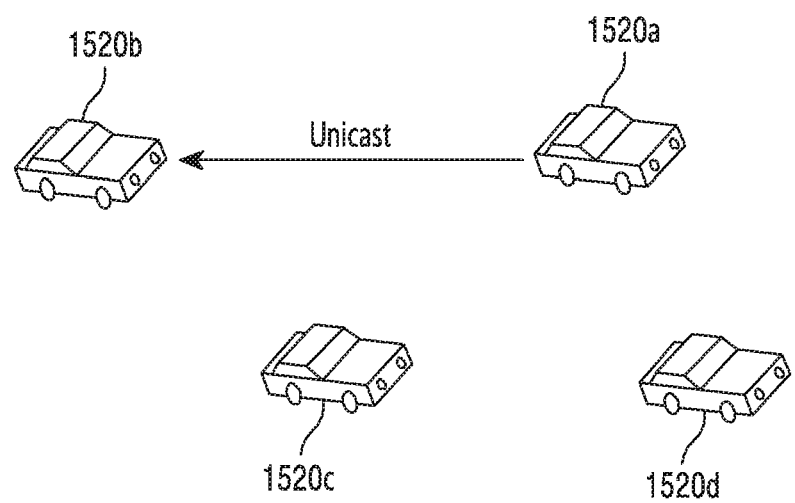
FIG. 15 illustrates an operation of unicasting transmission in a wireless communication system according to an embodiment of the disclosure.

FIG. 15 illustrates an example of unicasting transmission in a wireless communication system according to an embodiment of the disclosure.

Referring to FIG. 15, a first terminal 1520*a* transmits data to a second terminal 1520*b*. For another example, a direction in which the data is transmitted may be the other way round (e.g., from the second terminal 1520*b* to the first terminal 1520*a*). The other terminals 1520*c* and 1520*d* except for the first terminal 1520*a* and the second terminal 1520*b* may not receive data which is transmitted or received between the first terminal 1520*a* and the second terminal 1520*b* in a unicasting manner. In the data transmission or reception between the first terminal 1520a and the second terminal 1520b via the unicasting, data may be mapped to a resource predetermined between the first terminal 1520a and the second terminal 1520b, may be scrambled by using a value predetermined therebetween, or may be transmitted using a preconfigured value. Alternatively, control information relating to data transmission or reception between the first terminal 1520a and the second terminal 1520b via the unicasting may be mapped in a manner predetermined therebetween. Alternatively, the data transmission or reception between the first terminal 1520a and the second terminal 1520b via the unicasting may include an operation of mutually identifying a unique ID therebetween. Each of the terminals may be a mobile device, such as a vehicle. For the unicasting, at least one piece of separate control information, a physical control channel, and data may be further transmitted.

Figure 16A:
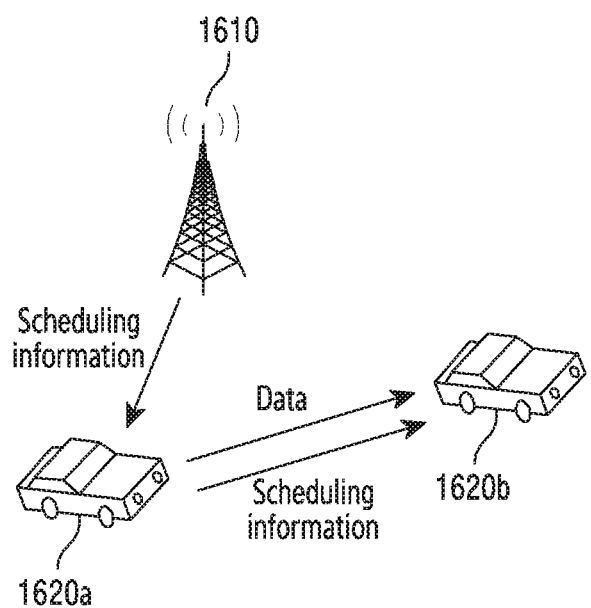
FIG. 16A illustrates an operation of sidelink data transmission according to scheduling of a base station in a wireless communication system according to an embodiment of the disclosure.

FIG. 16A illustrates an example of sidelink data transmission according to scheduling of a base station in a wireless communication system according to an embodiment of the disclosure.

FIG. 16A illustrates mode 1 indicating a method of transmitting sidelink data by a terminal having received scheduling information from a base station. In the disclosure, the method of performing sidelink communication based on scheduling information is referred to as "mode 1", but may be referred to as other terms.

Referring to FIG. 16A, a terminal 1620a (hereinafter, referred to as a "transmission terminal") for transmitting data in sidelink receives scheduling information for sidelink communication from a base station 1610. The transmission terminal 1620a having received the scheduling information transmits the sidelink data to another terminal 1620b (hereinafter, referred to as a "reception terminal"). The scheduling information for the sidelink communication is included in DCI, and the DCI may include at least one of the following items in Table 5 below.

TABLE 5

| Item | Description |
|---|---|
| Carrier Indicator | This may be used for scheduling sidelink of another carrier in the case in which carrier aggregation (CA) is applied. |
| Lowest index of sub-channel assignment for initial transmission | This may be used for frequency resource assignment of initial transmission. |
| Information to be included in sidelink control information | Frequency resource assignment information including information on resource assignment or resource reservation information for initial transmission, retransmission, and subsequent N-th transmission Information on a time interval between initial transmission and retransmission |
| Information on sidelink slot structure | This may include information on which slot and which symbols may be used for sidelink. |
| HARQ-ACK/CSI feedback timing information | This may include timing information for transmitting HARQ-ACK or CSI feedback in sidelink to a base station. |
| Receiver ID | This indicates ID information on which terminals are to receive. |
| Quality-of-Service (Qos) information such as priority | This indicates information on the priority which data to be transmitted has. |

Scheduling may be performed for one time of sidelink transmission, or may be performed for regular transmission or semi-persistent scheduling (SPS) or configured grant transmission. A scheduling method may be indicated by an indicator included in DCI, or may be indicated by an ID value or an RNTI scrambled to CRC to be added to DCI. DCI for sidelink transmission may further include a padding bit (e.g., 0 bit), wherein the DCI for sidelink transmission has different sizes from other DCI formats, such as DCI for downlink scheduling or DCI for uplink scheduling.

After receiving DCI for sidelink scheduling from the base station 1610, the transmission terminal 1620a transmits a PSCCH including sidelink scheduling information, and then transmits a PSSCH which is data corresponding thereto. The PSCCH, which is sidelink scheduling information, may include SCI, and the SCI may include at least one of the following items in Table 6 below.

TABLE 6

| Item | Description |
|---|---|
| HARQ process number | This indicates an HARQ process ID for HARQ-related operation of data to be transmitted. |
| New data indicator (NDI) | This indicates information on whether currently transmitted data is new data. |
| Redundancy version (RV) | This indicates information on which parity bit is transmitted when data is mapped after channel coding. |
| Layer-1 source ID | This indicates ID information in a physical layer of a transmission terminal. |
| Layer-1 destination ID | This indicates ID information in a physical layer of a reception terminal. |
| Frequency-domain resource assignment for scheduling PSSCH | This indicates frequency-domain resource configuration information of data to be transmitted. |
| MCS | This indicates information on a modulation order and a coding rate. |
| QoS indication | This may include a priority, targeting latency/delay, a targeting distance, a targeting rate, etc. |
| Antenna port(s) | This indicates antenna port information for data transmission. |
| DMRS sequence initialization | This may include information such an ID value for initialization of a DMRS sequence. |
| PTRS-DMRS association | This may include information on PTRS mapping. |
| CBGTI | This may be utilized as an indicator for CBG-unit retransmission. |
| Resource reservation | This indicates information for a resource reservation. |
| Time gap between initial transmission and retransmission | This indicates time interval information between initial transmission and retransmission. |
| Retransmission index | This indicates an indicator for identifying retransmission. |
| Transmission format/cast type indicator | This indicates an indicator for identifying a transmission format or unicast/groupcast/broadcast. |
| Zone ID | This indicates information on a position of a transmission terminal. |
| NACK distance | This indicates a reference indicator for determining whether a reception terminal is to be transmitted HARQ-ACK/NACK. |
| HARQ feedback indication | This may include whether HARQ feedback is to be transmitted or is being transmitted. |
| Time-domain resource assignment for scheduling PSSCH | This indicates time-domain resource information of sidelink data to be transmitted. |
| Second SCI indication | This indicates an indicator including mapping information of second SCI in the case of 2-stage control information. |
| DMRS pattern | This indicates information on a DMRS pattern (for example, a position of a symbol to which a DMRS is mapped). |

Control information including at least one of the above-listed items in Table 6 may be included in one piece of SCI or two pieces of SCI, in order to be transmitted to the terminal. A method in which the control information is divided into two pieces of SCI may be referred to as "2-stage SCI".

Figure 16B:
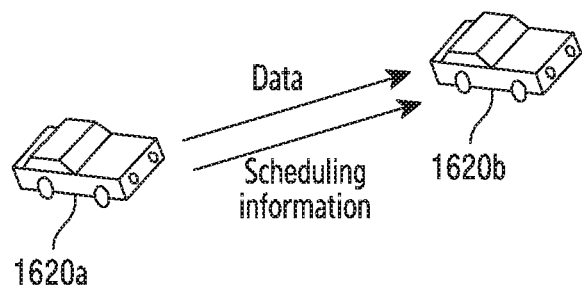
FIG. 16B illustrates an operation of sidelink data transmission without scheduling of a base station in a wireless communication system according to an embodiment of the disclosure.

FIG. 16B illustrates an example of sidelink data transmission without scheduling of a base station in a wireless communication system according to an embodiment of the disclosure.

Referring to FIG. 16B, it illustrates mode 2 indicating a method of transmitting sidelink data by a terminal without receiving scheduling information from a base station. In the disclosure, the method of performing sidelink communication without scheduling information is referred to as "mode 2", but may be referred to as other terms. A terminal 1620a for transmitting data in sidelink may transmit sidelink scheduling control information and sidelink data to a reception terminal 1620b based on determination by the terminal 1620a itself without scheduling of a base station. In this case, for the sidelink scheduling control information, SCI having the same format as that of the SCI used in mode 1 sidelink communication may be used. For example, the scheduling control information may include at least one of the above-listed items in Table 6.

Figure 17:
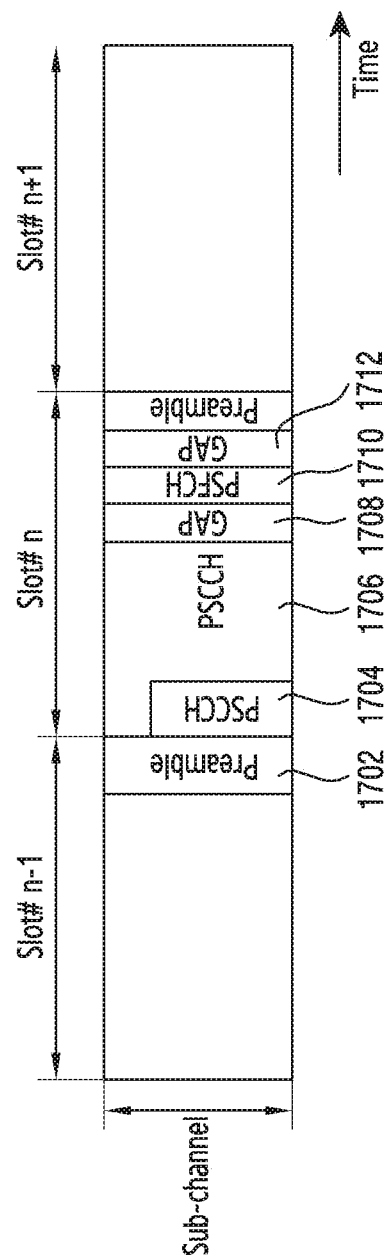
FIG. 17 illustrates an operation of a channel structure of a slot used for sidelink communication in a wireless communication system according to an embodiment of the disclosure.

FIG. 17 illustrates an example of a channel structure of a slot used for sidelink communication in a wireless communication system according to an embodiment of the disclosure. FIG. 17 illustrates physical channels mapped to a slot for sidelink communication.

Referring to FIG. 17, a preamble 1702 is mapped before the start of a slot, that is, is mapped to the back-end of a previous slot. Then, from the start of the slot, a PSCCH 1704, a PSSCH 1706, a gap 1708, a physical sidelink feedback channel (PSFCH) 1710, and a gap 1712 are mapped.

Before transmitting a signal in the corresponding slot, a transmission terminal transmits the preamble 1702 in one or more symbols. The preamble may be used for correctly performing an AGC operation of adjusting amplification strength when a reception terminal amplifies power of a received signal. Further, the preamble may be transmitted or may not be transmitted according to whether a signal is transmitted in a previous slot of a transmission terminal. In other words, when the transmission terminal transmits a signal to the same terminal in a previous slot (e.g., slot #n−1) of the corresponding slot (e.g., slot #n), transmission of the preamble 1702 may be omitted. The preamble 1702 may be referred to as a "synchronization signal", a "sidelink synchronization signal", a "sidelink reference signal", a "midamble", an "initial signal", a "wake-up signal", or other terms having equivalent technical meanings to those of the above-described terms.

The PSCCH 1704 including control information may be transmitted by using symbols transmitted in the beginning of the slot, and the PSSCH 1706 scheduled by control information of the PSCCH 1704 may be transmitted. At least a part of SCI, which is control information, may be mapped to the PSSCH 1704. Then, the gap 1708 exists, and the PSFCH 1710, which is a physical channel for transmitting feedback information, is mapped.

The terminal may be preconfigured to receive a position of a slot in which PSFCH transmission is allowed. The pre-configuration of receiving the position of the slot may be predetermined in the process of producing a terminal, may be transmitted when being accessed to a sidelink-related system, may be transmitted from a base station when being accessed to the base station, or may be transmitted from other terminals.

FIG. 17 illustrates that the PSFCH 1710 is positioned at the end of the slot. By securing a gap 1708 indicating a predetermined empty time between the PSSCH 1704 and the PSFCH 1710, the terminal having transmitted or received the PSSCH 1704 may prepare reception or transmission of the PSFCH 1710 (e.g., transmission/reception switch). After the PSFCH 1710, there is a gap 1712 which is a predetermined empty interval.

In an embodiment of FIG. 17, it is described that a separate preamble signal for performing an AGC operation is transmitted in a physical channel structure within a sidelink slot. However, according another embodiment of the disclosure, a separate preamble signal is not transmitted, but it is also possible for a receiver of a reception terminal to perform an AGC operation by using a physical channel for transmission of control information or data, while receiving the physical channel for transmission of control information or data.

Figure 18A:
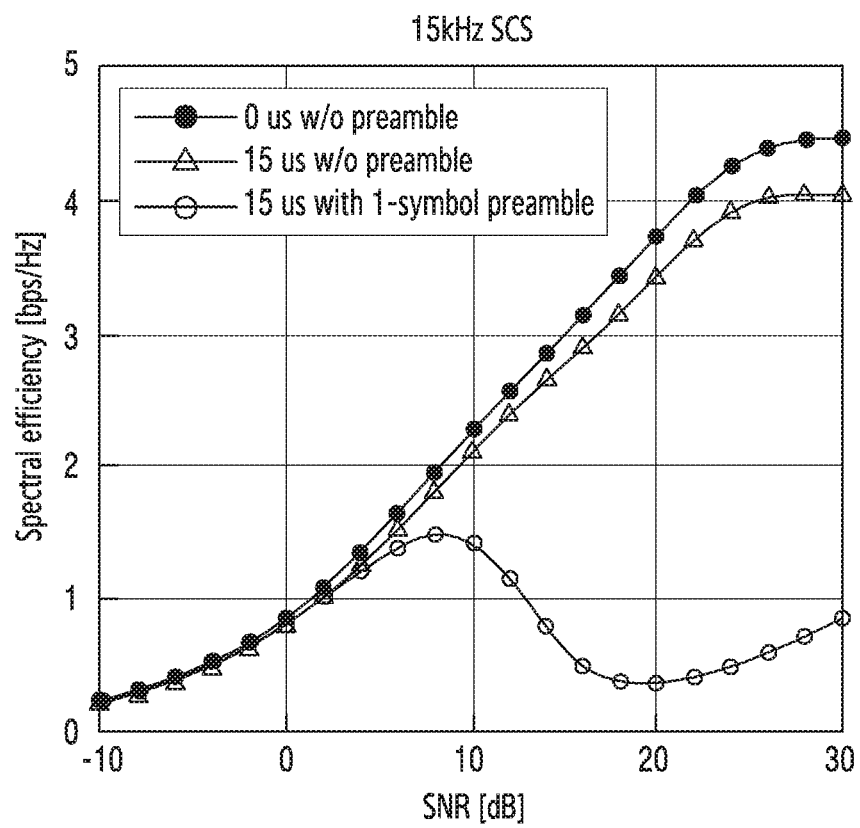
FIG. 18A illustrates spectral efficiency according to channel quality when 15 kHz subcarrier spacing (SCS) is used in a wireless communication system according to an embodiment of the disclosure.
Figure 18B:
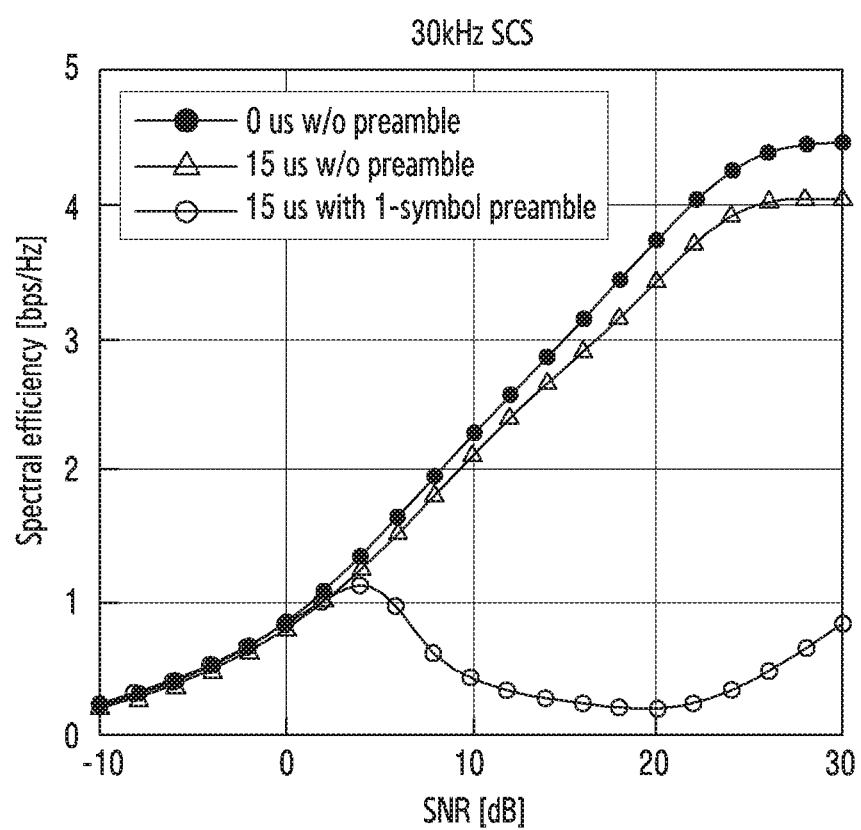
FIG. 18B illustrates spectral efficiency according to channel quality when 30 kHz subcarrier spacing is used in a wireless communication system according to an embodiment of the disclosure.
Figure 18C:
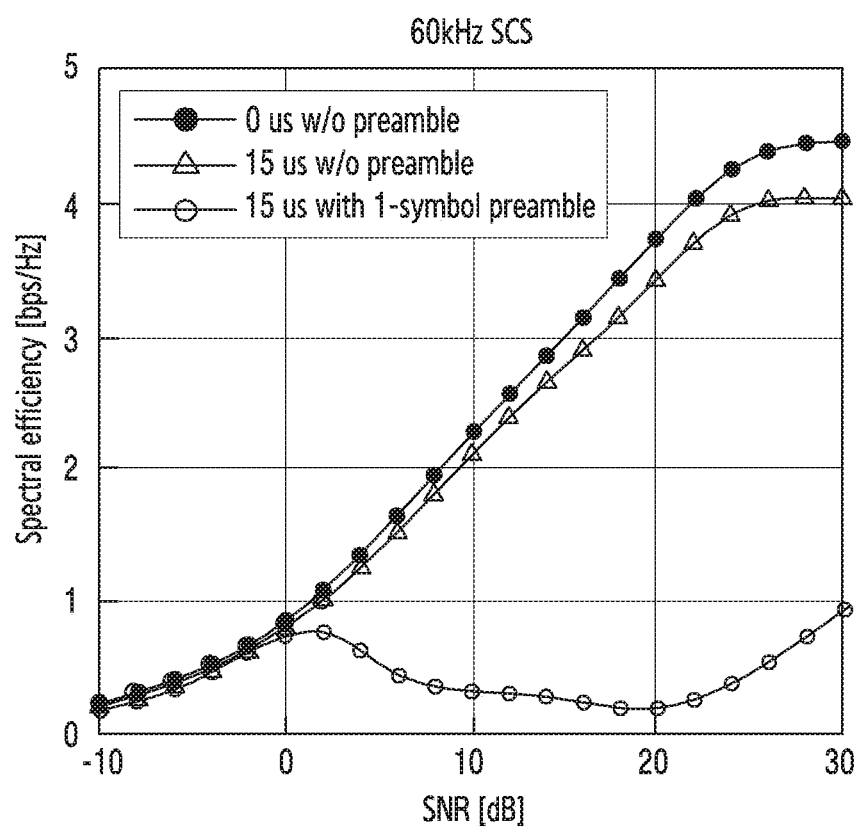
FIG. 18C illustrates spectral efficiency according to channel quality when 60 kHz subcarrier spacing is used in a wireless communication system according to an embodiment of the disclosure.

FIG. 18A illustrates spectral efficiency according to channel quality when 15 kHz subcarrier spacing (SCS) is used in a wireless communication system according to an embodiment of the disclosure, FIG. 18B illustrates spectral efficiency according to channel quality when 30 kHz subcarrier spacing is used in a wireless communication system according to an embodiment of the disclosure, and FIG. 18C illustrates spectral efficiency according to channel quality when 60 kHz subcarrier spacing is used in a wireless communication system according to an embodiment of the disclosure.

Referring to FIGS. 18A to 18C, they illustrate a difference between the performance (e.g., frequency efficiency or a transmission rate) in the case (15 us with 1-symbol preamble) in which one symbol is assigned to a preamble with AGC settling time at 15 us and the performance in the case (15 us w/o preamble) of performing an AGC operation while receiving a data channel without a separate preamble signal with AGC settling time at 15 us, in three different environments having 15 kHz, 30 kHz, or 60 kHz subcarrier spacing. When there is no separate preamble, the AGC operation is performed during some intervals of the received data channel. In this case, a part received during the AGC operation may not be used for data demodulation. Referring to FIGS. 18A to 18C, it is identified that performing data decoding without receiving one symbol causes a large deterioration in the performance. Therefore, it is expected that by transmitting a separate preamble, performing the AGC operation by a reception terminal using the preamble will bring a performance gain. Further, it is identified that, even though there is no separate preamble signal, the performance is far better when the AGC settling time is 0 us (0 us w/o preamble). In conclusion, it is identified that the shorter the AGC settling time, the better the data reception performance or the better the data rate performance. Accordingly, it is expected that embodiments with respect to the AGC operation proposed in the disclosure will bring a performance gain.

Hereinafter, the disclosure will describe embodiments for adjusting a gain of a signal, together with a specific example of a condition for determining an initial value.

According to an embodiment of the disclosure, an initial value may be determined based on a resource pool in use. When receiving a signal from a resource pool preconfigured for sidelink data reception or transmission, the terminal records strength of the signal received from the resource pool. For example, when receiving a signal from resource pool A, the terminal keeps information up-to-date by updating the strength of the signal recently received. Then, when the terminal is to again receive the signal from resource pool A while receiving the signal from another resource pool, the terminal may determine an initial value for performing an AGC operation based on a reception strength value of a signal received from pre-stored resource pool A. This is because there is a possibility that the strength of the signals received from the identical resource pool may be similar. Here, the information to be recorded is described as a strength value of a signal, but may be replaced with another value corresponding to the strength of a signal, for example, a gain value. Hereinafter, an embodiment illustrating determination of an initial value based on a resource pool will be described with reference to FIG. 19.

Figure 19:
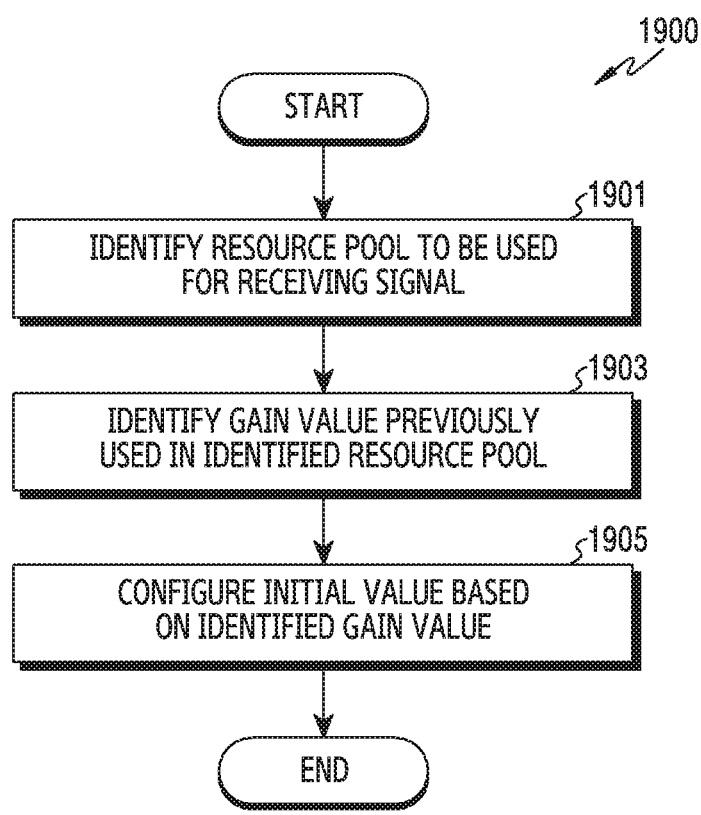
FIG. 19 illustrates a flowchart of determining an initial value based on a resource pool in a wireless communication system according to an embodiment of the disclosure.

FIG. 19 illustrates a flowchart 1900 of determining an initial value based on a resource pool in a wireless communication system according to an embodiment of the disclosure. FIG. 19 illustrates an operation method of a terminal 120 or a terminal 130.

Referring to FIG. 19, at operation 1901, the terminal identifies a resource pool to be used for receiving a signal. The terminal may perform sidelink communication in one or more configured resource pools. When receiving a signal, the terminal may monitor a PSCCH in one of the one or more resource pools, receive SCI, and then receive the signal. When the SCI is detected, the terminal identifies which resource pool is currently being used. Information on the resource pool may be pre-stored in the terminal, or may be received from the base station. Accordingly, the terminal may identify in which resource pool a resource to be used for receiving a signal is currently included by using information on the resource pool.

At operation 1903, the terminal identifies a gain value which has been previously used in the identified resource pool. For example, the terminal stores a gain value used at the time of an AGC operation performed while receiving the signal. Accordingly, the terminal may identify the gain value used at the time of previously receiving the signal in the identified resource pool. In this case, the identified gain value may be a gain value previously used at the time when signal reception is terminated, or a gain value having been used before a predetermined interval from the termination. Here, the length of the predetermined interval may be predefined, or adaptively determined according to a change in the gain value.

At operation 1905, the terminal configures an initial value based on the identified gain value. For example, the terminal may configure the initial value to be the same value as the identified gain value. For another example, the terminal may configure the initial value by applying an offset having a predetermined size to the identified gain value. Here, the offset may be defined as a fixed value, or may be dependent on another factor other than the gain value.

In the embodiment described with reference to FIG. 19, the value stored at the time of receiving the signal is a gain value. According to another embodiment of the disclosure, a reception strength value of a signal may be stored instead of the gain value. Since a settled value targeted by the size of a gain-controlled signal is predefined, the reception strength value of a signal may be converted to a gain value to be required. Accordingly, the reception strength value may be stored instead of the gain value. In embodiments to be described below, the gain value may also be replaced with the reception strength value.

According to an embodiment of the disclosure, an initial value may be determined based on identification of a transmission terminal. For example, if the transmission terminal can be identified, the initial value may be determined based on a reception strength value of a signal previously received from the transmission terminal, or a gain value used at the time of previously receiving a signal from the transmission terminal. Further, if a time point when a specific terminal transmits data can be expected, an operation of configuring the initial value may be easier.

For example, since timing of transmitting feedback information received after data transmission can be expected, the initial value may be determined when receiving the feedback information. In other words, the terminal having transmitted sidelink data may perform an AGC operation according to whether HARQ-ACK information or channel state information transmitted by a reception terminal as feedback is transmitted, or according to a feedback time point. A position of a slot from which the terminal can transmit a PSFCH may be preconfigured. The pre-configuration of the position of the slot may include the case in which the terminal is predefined in the production process, the case in which the position is acquired when the terminal accesses a sidelink-related system, the case in which the position is provided by a base station when the terminal accesses the base station, or the case in which the position is acquired from other terminals.

Figure 20A:
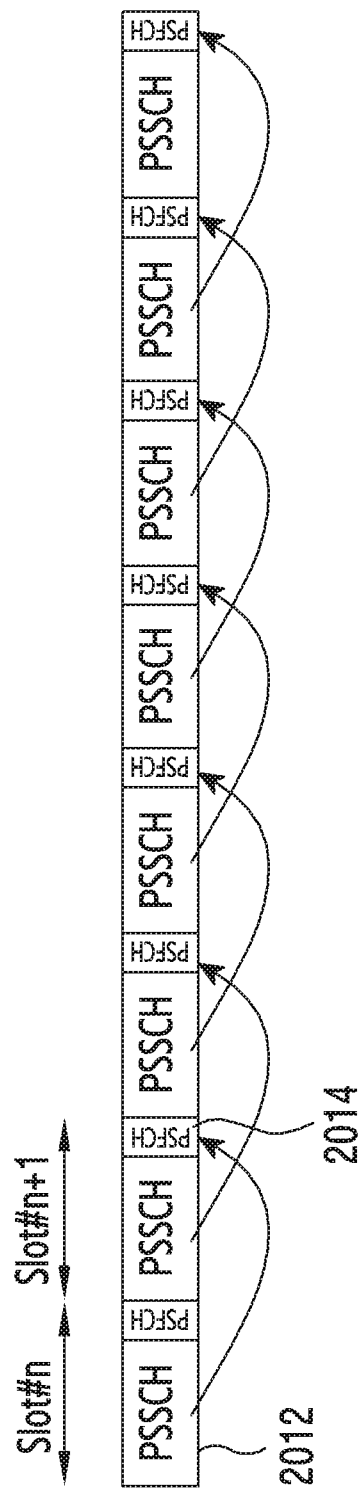
FIG. 20A illustrates an operation of feedback channel distribution in a wireless communication system according to an embodiment of the disclosure.

FIG. 20A illustrates a first example of feedback channel distribution in a wireless communication system according to an embodiment of the disclosure. FIG. 20A illustrates the case in which a resource capable of transmitting or receiving a PSFCH is assigned to every slot.

Referring to FIG. 20A, an arrow indicates a PSFCH slot from which HARQ-ACK feedback information corresponding to a PSSCH is transmitted. Referring to FIG. 20A, the HARQ-ACK feedback information on a PSSCH 2012 transmitted in slot #n is transmitted from a PSFCH 2014 of slot #n+1. Since the PSFCH is assigned to every slot, the PSFCHs may correspond to the slots including the PSSCHs, respectively. For example, when configuring periodicity of a resource capable of transmitting or receiving a PSFCH by a parameter, such as periodicity_PSFCH_resource, in FIG. 20A, periodicity_PSFCH_resource indicates a 1 slot. Alternatively, the periodicity may be configured in a msec unit, and may be indicated as a value which is assigned for every slot according to subcarrier spacing.

Figure 20B:
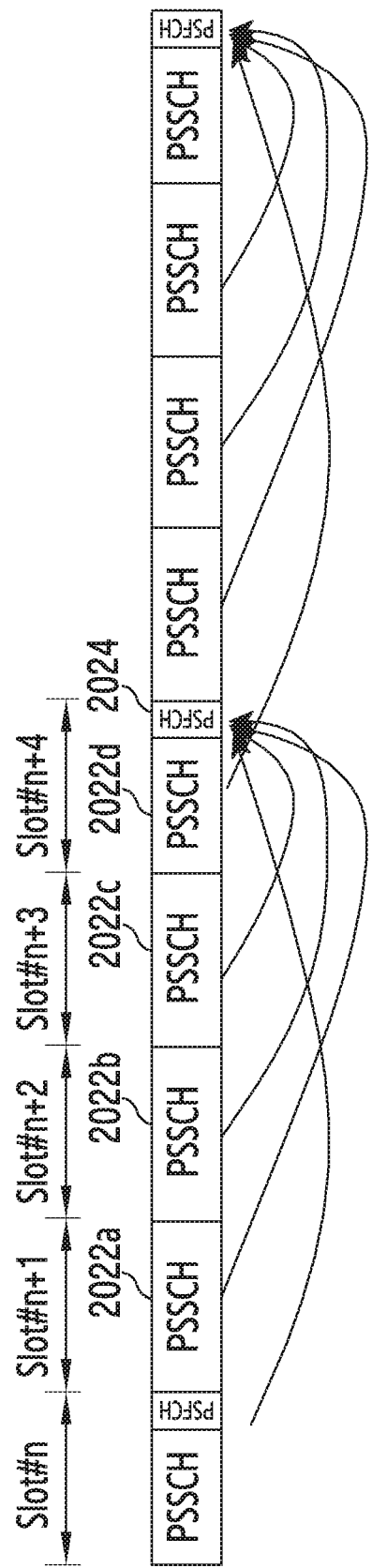
FIG. 20B illustrates an operation of feedback channel distribution in a wireless communication system according to an embodiment of the disclosure.

FIG. 20B illustrates a second example of feedback channel distribution in a wireless communication system according to an embodiment of the disclosure. FIG. 20B illustrates the case in which a resource is assigned to transmit or receive a PSFCH in every four slots.

Referring to FIG. 20B, an arrow indicates a PSFCH slot from which HARQ-ACK feedback information corresponding to a PSSCH is transmitted.

Referring to FIG. 20B, a PSFCH is included only in the last slot of four slots. Similarly, a PSFCH is included only in the last slot of subsequent four slots. Accordingly, the HARQ-ACK feedback information on a PSSCH 2022*a* of slot #n, a PSSCH 2022*b* of slot #n+1, a PSSCH 2022*c* of slot #n+2, and a PSSCH 2022*d* of slot #n+3 is transmitted from a PSFCH 2024 of slot #n+4. Here, an index of a slot may be an index for slots included in a resource pool. For example, actually, the four slots are not physically consecutive slots, but may be consecutively enumerated slots among slots included in a resource pool (or a slot pool) used for sidelink communication between terminals. HARQ-ACK feedback information of a PSSCH transmitted in the fourth slot may not be transmitted from a PSFSH of the same slot. This may be because processing time to be taken for the terminal to end decoding the PSSCH transmitted in the slot and transmit the PSFCH in the same slot is not short.

When the terminal transmits or receives a PSFCH, the number of HARQ-ACK feedback bits included in the PSFCH is to be identified to correctly perform the transmission or reception. The number of HARQ-ACK feedback bits included in the PSFCH and the PSSCH of which HARQ-ACK bits are to be included may be determined based on a combination of one or more or two or more of the items listed in Table 7 below.

TABLE 7

Item

Periodicity of a slot capable of transmitting or receiving a PSFCH by a parameter such as periodicity_PSFCH_resource
Whether HARQ-ACK is bundled. This may be a value acquired by determining, by an AND operation, HARQ-ACK bits of a PSFCH transmitted in a predetermined number of slots before PSFCH transmission or reception (i.e., if any one is NACK, it is determined as NACK).
Number of transport blocks (TBs) included in a PSSCH
Whether code block group (CBG)-unit retransmission is used or configured
Whether HARQ-ACK feedback is activated
Number of PSSCHs actually transmitted or received
Minimum processing time required for a terminal to process a PSSCH and prepare PSFCH transmission When a resource capable of transmitting a PSFCH is configured or given in slot #n+x, the terminal having received the PSSCH in slot #n transmits HARQ-ACK feedback information of the PSSCH by using the PSFCH of slot #n+x, wherein x is the smallest among integers equal to or greater than K. K may be a value preconfigured by a transmission terminal, or may be a value configured in a resource pool from which the PSSCH or the PSFCH is transmitted. In order to configure K, each terminal may exchange information on its capability with the transmission terminal in advance. For example, K may be determined according to at least one of subcarrier spacing, terminal capability, a value configured with the transmission terminal, or a configuration of a resource pool.

For example, when N=2 and K=1, that is, when a PSFCH transmission resource is configured for every N(=2) slots in a resource pool and HARQ-ACK of a PSSCH is transmittable in a slot subsequent to at least K (=1) slot (i.e., the following block in the case of K=1) after PSSCH transmission, a slot in which HARQ-ACK feedback is transmitted may be determined as shown in FIG. 21.

FIG. 21 illustrates timing of transmitting feedback information corresponding to sidelink data in a wireless communication system according to an embodiment of the disclosure.

Referring to FIG. 21, the number of HARQ-ACK feedback bits to be transmitted by a terminal may be 2 bits in all PSFCHs. For example, when a reception terminal fails to receive a PSSCH in both slot #n and slot #n+2, or to receive a PSCCH for scheduling a PSSCH, a reception terminal is not required to transmit a PSFCH including HARQ-ACK feedback information in slot #n+3. Further, when the reception terminal receives a PSSCH in slot #n+3 but fails to receive a PSCCH for scheduling the PSSCH in slot #n+4, the reception terminal may transmit 1-bit of HARQ-ACK information on slot #n+3 in slot #n+8. Further, when the reception terminal receives a PSSCH in slot #n+3 but fails to receive a PSSCH or a PSCCH for scheduling the PSSCH in slot #n+4, the reception terminal may transmit HARQ-ACK information on slot #n+3 and HARQ-ACK information on slot #n+4 in slot #n+8. In this case, since the reception terminal has failed to receive the PSSCH in slot #n+4, the HARQ-ACK feedback on the slot #n+4 may be configured to be NACK.

For example, when transmitting a PSFCH in a specific slot, a reception terminal may determine the number of HARQ-ACK feedback bits to be included in the PSFCH, based on a slot included in a resource pool, a slot to which a PSFCH resource is configured, periodicity N to which a PSFCH resource is configured, and K configured or determined according to a processing time of a terminal. The number of HARQ-ACK feedback bits may be determined according to Equation 1 below.

$$N_{HARQ-ACK}^n = N_{slot}^{(k-K+1)\sim(n-K)} \qquad \text{Equation 1}$$

In Equation 1, $N_{HARQ-ACK}^n$ indicates the number of HARQ-ACK bits to be included in a PSFCH transmitted in slot n, $N_{slot}^{(k-K+1)\sim(n-K)}$ indicates the number of slots included in respective resource pools among slot #(k-K+1) to slot #(n-K), N indicates PSFCH assignment periodicity, and K indicates an interval between a PSSCH and a PSFCH which correspond to each other. Here, slot #K indicates a slot including a PSFCH resource configured to be transmitted right before the PSFCH transmittable in slot #n.

When N and K are given, the maximum number of HARQ-ACK feedback bits to be transmitted from one PSFCH by a terminal may be expressed as in Equation 2 below.

$$N_{HARQ-ACK}^{PSFCH} = N+K-1 \qquad \text{Equation 2}$$

In Equation 2, $N_{HARQ-ACK}^{PSFCH}$ indicates the maximum number of HARQ-ACK feedback bits to be transmitted from one PSFCH by a terminal, N indicates PSFCH assignment periodicity, and K indicates an interval between a PSSCH and a PSFCH which correspond to each other.

The terminal receiving feedback information may perform an AGC operation based on a feedback channel capable of having the characteristic as described above. For example, the terminal may predetermine an initial value for performing an AGC operation before the start of a PSFCH, and may perform the AGC operation.

Figure 22:
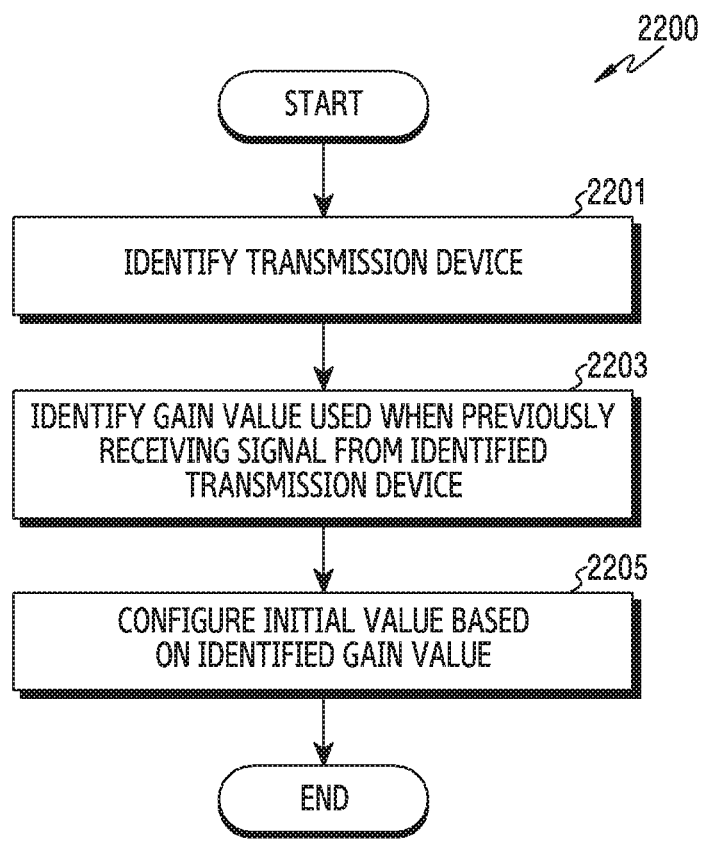
FIG. 22 illustrates a flowchart of determining an initial value based on identification of a transmission device in a wireless communication system according to an embodiment of the disclosure.

FIG. 22 illustrates a flowchart 2200 of determining an initial value based on identification of a transmission device in a wireless communication system according to an embodiment of the disclosure. FIG. 22 illustrates an operation method of a terminal 120 or a terminal 130.

Referring to FIG. 22, at operation 2201, the terminal identifies a transmission device. Before receiving data, the terminal may identify a counterpart device, i.e., the transmission device, through various means. For example, when data to be received is feedback information, the terminal may identify that the terminal having received the data corresponding to the feedback information is a device which has transmitted the feedback information. Accordingly, before receiving feedback information through a feedback channel, the terminal may identify the transmission device.

At operation 2203, the terminal identifies a gain value used when previously receiving a signal from the identified transmission device. For example, the terminal stores a gain value used at the time of an AGC operation performed while receiving the signal. Accordingly, the terminal may identify a gain value used when previously receiving the signal from the identified transmission device. In this case, the identified gain value may be a gain value previously used at the time when signal reception is terminated, or a gain value having been used before a predetermined interval from the termination. Here, the length of the predetermined interval may be predefined, or adaptively determined according to a change in the gain value.

At operation 2205, the terminal configures an initial value based on the identified gain value. For example, the terminal may configure an initial value to be the same value as the identified gain value. For another example, the terminal may configure the initial value by applying an offset having a predetermined size to the identified gain value. Here, the offset may be predefined as a fixed value, or may be dependent on another factor other than the gain value.

In the embodiment described with reference to FIG. 22, the terminal identifies the transmission device based on a corresponding relationship between data and feedback information. However, according to another embodiment of the disclosure, even when receiving data that is not feedback information, the terminal may also configure the initial value for an AGC operation based on the identification of the transmission device. When receiving sidelink data, the terminal may identify the transmission device using SCI received before the reception of the data. Therefore, the terminal may perform similar operations to those of FIG. 22 with respect to the transmission device identified using the SCI.

According to an embodiment of the disclosure, the terminal may determine the initial value for an AGC operation based on a total frequency bandwidth of a resource pool or a corresponding BWP configured for receiving a PSFCH. An embodiment of determining an initial value based on the total frequency bandwidth of the resource pool or the corresponding BWP configured for receiving a PSFCH will be described with reference to FIG. 23 below.

Figure 23:
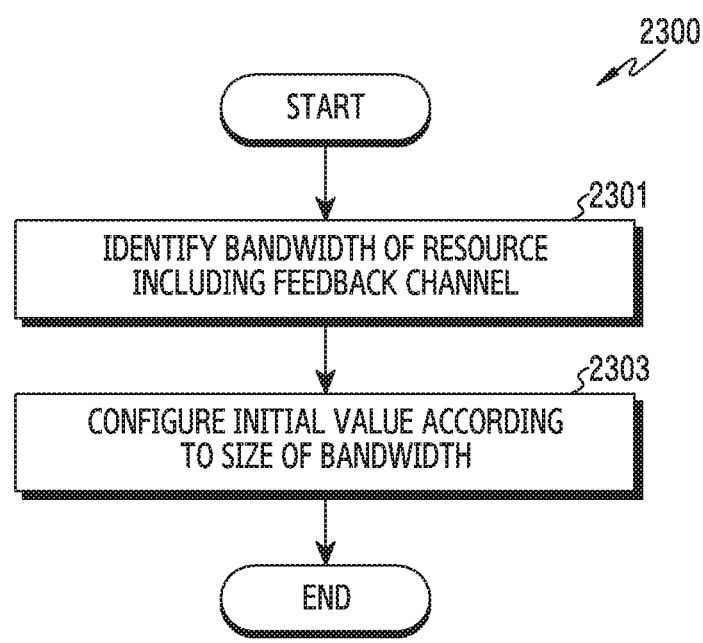
FIG. 23 illustrates a flowchart of determining an initial value based on a bandwidth of a resource including a feedback channel in a wireless communication system according to an embodiment of the disclosure.

FIG. 23 illustrates a flowchart 2300 of determining an initial value based on a bandwidth of a resource including a feedback channel in a wireless communication system according to an embodiment of the disclosure. FIG. 23 illustrates an operation method of a terminal 120 and a terminal 130.

Referring to FIG. 23, at operation 2301, the terminal identifies a bandwidth of a resource including a feedback channel Here, the feedback channel may include a PSFCH, and the resource may include one of a resource pool and a BWP. The bandwidth of the resource pool or the BWP is indicated by configuration information on the resource pool or the BWP. Accordingly, the terminal may identify a resource pool or a BWP to which a feedback resource belongs, and may identify a bandwidth using configuration information on the identified resource pool and the BWP.

At operation 2303, the terminal configures an initial value according to a size of a bandwidth. For example, since there is high possibility that a signal from another terminal may also be received when a frequency bandwidth of a resource pool or a BWP including a PSFCH to be received is large, the terminal may determine the initial value to be relatively small. Since there is a low possibility that a signal from another terminal may also be received when a frequency bandwidth of a resource pool or a BWP is small, the terminal may determine the initial value to be relatively large.

The above-described embodiment is related to determination of an initial value for an AGC operation in sidelink communication performed between terminals. However, the disclosure is not limited to sidelink communication, and it is possible to adaptably configure an initial value for communication between a base station and a terminal as well.

According to an embodiment of the disclosure, an AGC operation may be performed based on information on a base station transmission beam. For example, while a base station transmits a signal to a terminal, different transmission beams may be applied to each time interval (e.g., a symbol, a slot, a subframe, an SSB, etc.).

Figure 24:
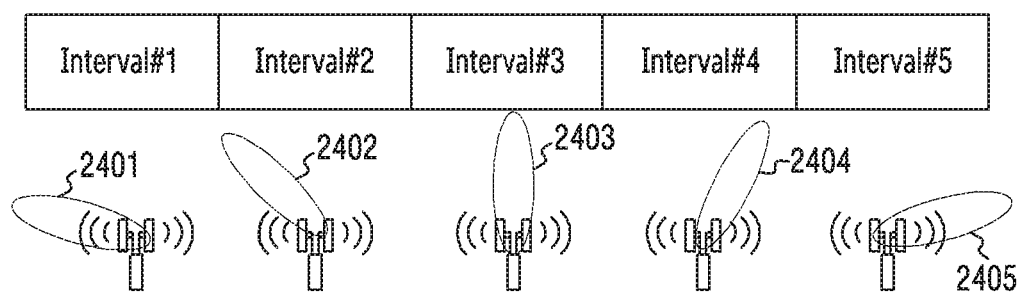
FIG. 24 illustrates an operation of a transmission beam change in a base station in a wireless communication system according to an embodiment of the disclosure.

FIG. 24 illustrates an example of a transmission beam change in a base station in a wireless communication system according to an embodiment of the disclosure. FIG. 24 illustrates an example of transmitting a control signal and/or a data signal while changing a transmission beam according to a change of a time interval.

Referring to FIG. 24, in each interval, a base station may perform analog beamforming using beams 2401 to 2405 in different directions from each other. In this case, since a strength of a signal received by the terminal may change according to the transmission beam of the base station, an efficient AGC operation is required. The terminal may store a reception strength value of a signal transmitted through a specific transmission beam; then, when receiving a signal transmitted through the identical transmission beam, identify the identity of the transmission beams; and configure an initial value for an AGC operation to correspond to the stored strength value of a signal. An embodiment based on the identification of the transmission beam will be described with reference to FIG. 25.

Figure 25:
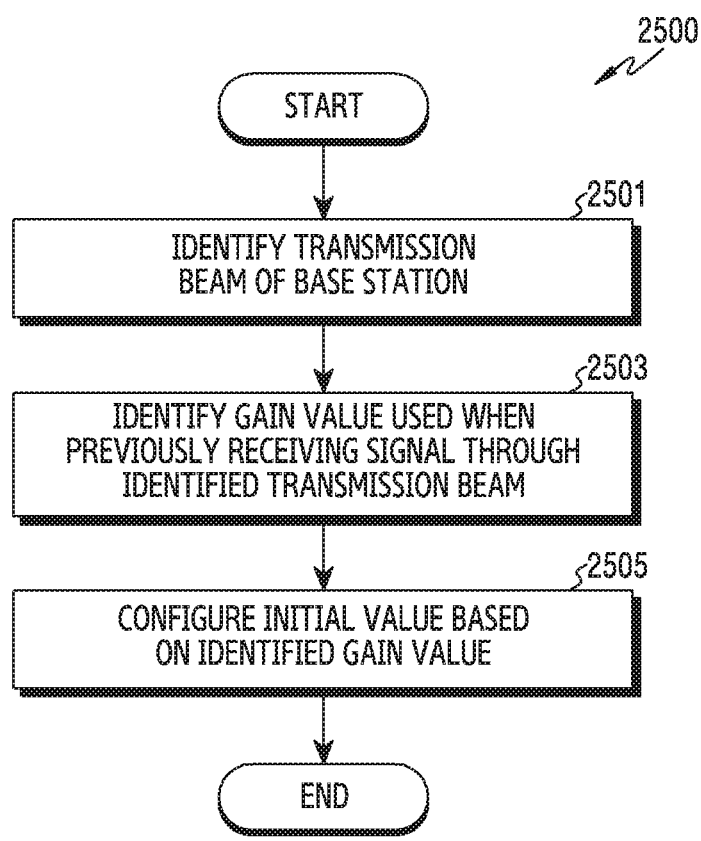
FIG. 25 illustrates a flowchart of determining an initial value based on a transmission beam in a wireless communication system according to an embodiment of the disclosure.

FIG. 25 illustrates a flowchart 2500 of determining an initial value based on a transmission beam in a wireless communication system according to an embodiment of the disclosure. FIG. 25 illustrates an operation method of a terminal 120 or a terminal 130.

Referring to FIG. 25, at operation 2501, the terminal identifies a transmission beam of a base station. Before receiving a signal in a specific time interval (e.g., a symbol, a slot, a subframe, etc.), the terminal may identify through which transmission beam of the base station the signal is transmitted. Here, identification of the transmission beam may indicate one of identifying an independent characteristic (e.g., an index) of the used transmission beam, and identifying substantial identity (e.g., QCL) with another transmission beam. For example, the terminal may use information (e.g., transmission configuration indication (TCI)-state information) included in control information (e.g., DCI) for data transmitted from a transmission beam or information (e.g., spatial relation information) included in configuration information (e.g., an RRC message) for transmitted control information to identify a transmission beam used in a corresponding interval. For another example, the terminal may use a BWP for transmitting a control signal to identify a transmission beam used in a corresponding interval. For another example, the terminal may use information on a transmission beam pattern provided by the base station to identify a transmission beam used in a corresponding interval. For another example, the terminal may use a repetition pattern of a series of signals (e.g., SSBs) transmitted while sweeping a transmission beam to identify a transmission beam used in a corresponding interval.

At operation 2503, the terminal identifies a gain value used when previously receiving a signal through the identified transmission beam. For example, the terminal stores a gain value used at the time of an AGC operation performed while receiving a signal. Accordingly, the terminal may identify a gain value used when previously receiving a signal through the identified transmission beam. Here, the identified gain value may be a gain value previously used at the time when signal reception is terminated, or a gain value having been used before a predetermined interval from the termination. Here, the length of the predetermined interval may be predefined, or adaptively determined according to a change in the gain value.

At operation 2505, the terminal configures an initial value based on the identified gain value. For example, the terminal may configure an initial value to be the same value as the identified gain value. For another example, the terminal may configure the initial value by applying an offset having a predetermined size to the identified gain value. Here, the offset may be predefined as a fixed value, or may be dependent on another factor other than the gain value.

According to an embodiment of the disclosure, the above-described adaptive control of the initial value for an AGC operation may be also applied to the case in which a base station transmits a signal using multiple TRPs.

Figure 26:
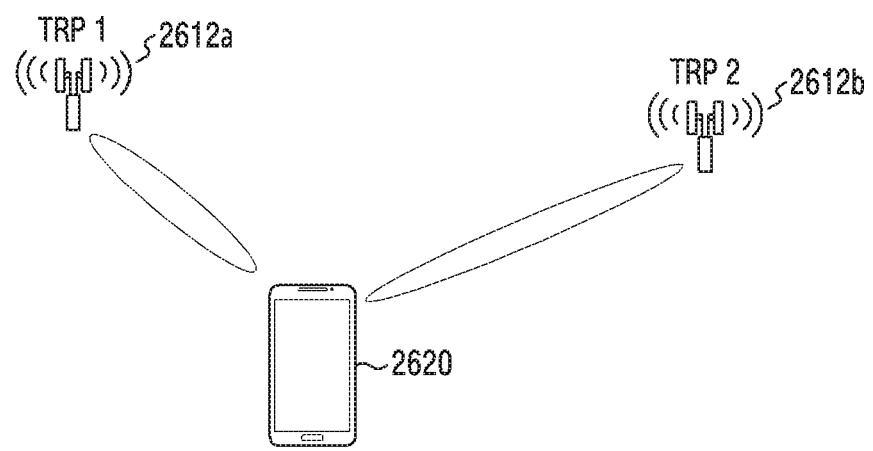
FIG. 26 illustrates an operation of an environment in which a plurality of transmission/reception points (TRPs) exist in a wireless communication system according to an embodiment of the disclosure.

FIG. 26 illustrates an example of an environment in which a plurality of TRPs exist in a wireless communication system according to an embodiment of the disclosure.

Referring to FIG. 26, it illustrates a terminal which receives signals from a plurality of TRPs. A terminal 2620 may receive a signal from at least one of a plurality of TRPs 2612*a* and 2612*b*. The strength of a signal may largely change depending on in which TRP the signal is received. Accordingly, the terminal 2620 may store the strength of a signal recently received in a specific TRP, and when an AGC operation for the transmitted signal is performed in the corresponding TRP, may configure an initial value for an AGC operation based on the stored strength of a signal. An embodiment based on identification of a TRP will be described with reference to FIG. 27 below.

Figure 27:
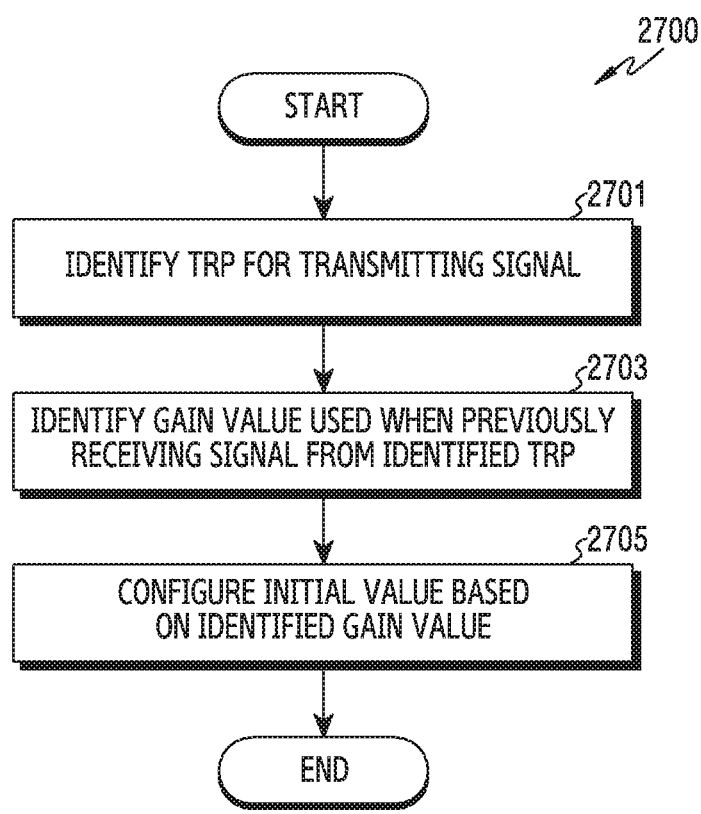
FIG. 27 illustrates a flowchart of determining an initial value based on identification of a TRP in a wireless communication system according to an embodiment of the disclosure.

FIG. 27 illustrates a flowchart 2700 of determining an initial value based on identification of a TRP in a wireless communication system according to an embodiment of the disclosure. FIG. 27 illustrates an operation method of a terminal 120 or a terminal 130.

Referring to FIG. 27, at operation 2701, the terminal identifies a TRP for transmitting a signal. Before receiving data, the terminal may identify the TRP through various means. Here, the identification of the TRP indicates one of identifying a TRP, and identifying whether the TRP is a TRP which has previously performed downlink communication. For example, before receiving data, the terminal may use control information on the data to identify the TRP. Specifically, the terminal may use a TCI indicator included in the control information to determine whether the TRP is a TRP which has previously performed downlink communication.

At operation 2703, the terminal identifies a gain value used when previously receiving a signal from the identified TRP. For example, the terminal stores a gain value used at the time of an AGC operation performed while receiving a signal. Accordingly, the terminal may identify a gain value used when previously receiving a signal from the identified transmission device. Here, the identified gain value may be a gain value previously used at the time when signal reception is terminated, or a gain value having been used before a predetermined interval from the termination. Here, the length of the predetermined interval may be predefined, or adaptively determined according to a change in the gain value.

At operation 2705, the terminal configures an initial value based on the identified gain value. For example, the terminal may configure an initial value to be the same value as the identified gain value. For another example, the terminal may configure the initial value by applying an offset having a predetermined size to the identified gain value. Here, the offset may be predefined as a fixed value, or may be dependent on another factor other than the gain value.

By configuring the initial value for an AGC operation as described above, AGC settling time may be reduced. In the case of the above-described embodiment of the disclosure, the initial value is determined based on a signal strength value or a gain value stored when previously receiving a signal in the same or similar environment. Here, the environment includes at least one of a transmission device, a resource, a TRP, and a transmission beam. According to another embodiment of the disclosure, channel-related information may be considered to determine the initial value. Hereinafter, an embodiment based on channel-related information will be described with reference to FIG. 28.

Figure 28:
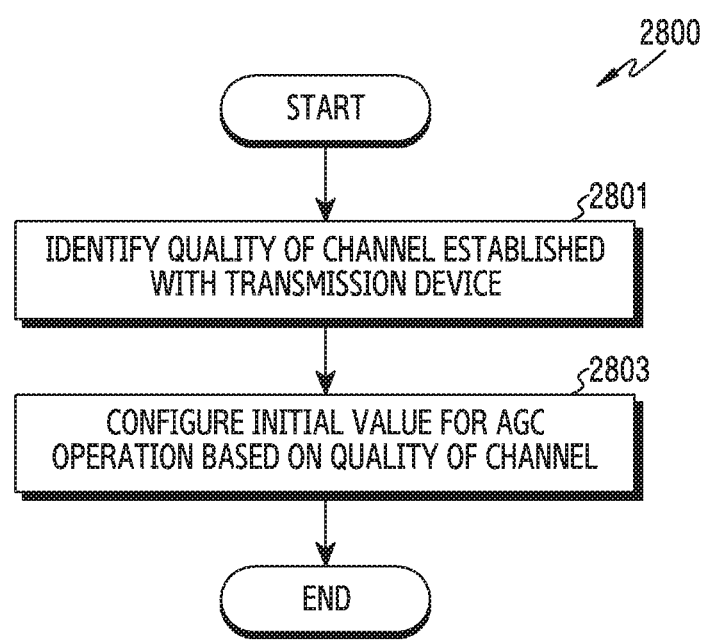
FIG. 28 illustrates a flowchart of determining an initial value based on channel-related information in a wireless communication system according to an embodiment of the disclosure.

FIG. 28 illustrates a flowchart 2800 of determining an initial value based on channel-related information in a wireless communication system according to an embodiment of the disclosure. FIG. 28 illustrates an operation method of a terminal 120 or a terminal 130.

Referring to FIG. 28, at operation 2801, the terminal identifies a quality of a channel established with a transmission device. Here, the transmission device includes one of another terminal, a base station, and a TRP. The quality of the channel may be acquired using a signal having been received before a signal subject to an AGC operation. Operation 2801 may be understood to be an operation of estimating quality of a channel, or an operation of identifying pre-estimated quality of a channel.

At operation 2803, the terminal configures an initial value for an AGC operation based on the quality of the channel. For example, when receiving a PSFCH, the terminal may determine, at the time when the PSFCH is transmitted, an initial value based on power of the terminal for transmitting the PSFCH or a state of a channel established with the transmitting terminal. As state of the channel is better, the initial value may be determined to be smaller.

According to another embodiment of the disclosure, the quality of a channel may be jointly used with other information. For example, the terminal may compensate a signal strength value or a gain value stored when previously receiving a signal in the same environment, based on the quality of the channel, and then may determine the initial value based on the compensated signal strength value or the compensated gain value. Specifically, when the quality of the channel is deteriorated compared to the quality at the time of previously receiving the signal, the signal strength value or the gain value may be compensated to be increased.

Methods according to an embodiment of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The one or more program may include instructions that cause the electronic device to perform the methods according to an embodiment of the disclosure as defined by the appended claims and/or disclosed herein.

The programs (software modules or software) may be stored in nonvolatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette.

Any combination of some or all of them may form a memory in which the program is stored. Further, a plurality of such memories may be included in the electronic device.

In addition, the programs may be stored in an attachable storage device which is accessible through communication networks, such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

Further, either multiple elements expressed in the description may be configured into a single element or a single element in the description may be configured into multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a first terminal in a wireless communication system, the method comprising:
    acquiring configuration information including resource information for indicating a bandwidth used by a second terminal to transmit a signal;
    identifying an initial value for an automatic gain control (AGC) operation based on the bandwidth;
    receiving, in one symbol for the AGC operation, a first sidelink signal from the second terminal; and
    receiving, in at least one symbol subsequent to the one symbol, a second sidelink signal from the second terminal,
    wherein the AGC operation is performed with respect to the received first sidelink signal and the second sidelink signal by using the initial value for the AGC operation.

2. The method of claim 1, wherein the configuration information further includes at least one of:
    identification information of the second terminal;
    information on a channel established with the second terminal;
    information on a signal previously transmitted by the second terminal; or
    information on an operation state of the terminal at the time of previously receiving a signal from the second terminal.

3. The method of claim 1, wherein the configuration information includes at least one of a gain value, which is used when previously receiving a signal from the second terminal, or a reception strength value of a signal previously received from the second terminal.

4. The method of claim 1,
    wherein the first sidelink signal corresponds to the second sidelink signal, and
    wherein the first sidelink signal and the second sidelink signal comprises hybrid automatic repeat request-acknowledgement (HARQ-ACK) information of the second terminal on a physical sidelink feedback channel (PSFCH).

5. The method of claim 1, wherein the acquiring of configuration information comprises:
    acquiring information on a resource pool from sidelink control information (SCI) for the second terminal.

6. The method of claim 1, wherein the acquiring of configuration information comprises:
    identifying a transmission beam used by the second terminal.

7. The method of claim 1, wherein
    the initial value is configured based on at least one value of a gain value used when previously receiving a signal from the second terminal and a reception strength value of a signal previously received from the second terminal.

8. A terminal in a wireless communication system, the terminal comprising:
    a transceiver; and
    at least one processor connected to the transceiver,
    wherein the at least one processor is configured to:
        acquire configuration information including resource information for indicating a bandwidth used by a second terminal to transmit a signal,
        identify an initial value for an automatic gain control (AGC) operation based on the bandwidth,
        receive, in one symbol for the AGC operation, a first sidelink signal from the second terminal, and
        receive, in at least one symbol subsequent to the one symbol, a second sidelink signal from the second terminal,
        wherein the AGC operation is performed with respect to the received first sidelink signal and the second sidelink signal by using the initial value for the AGC operation.

9. The terminal of claim 8, wherein the configuration information includes at least one of:
    identification information of the second terminal;
    information on a channel established with the second terminal;
    information on a signal previously transmitted by the second terminal; or
    information on an operation state of the terminal at the time of previously receiving a signal from the second terminal.

10. The terminal of claim 8, wherein the configuration information includes at least one of a gain value for the AGC, which is used when previously receiving a signal from the second terminal, or a reception strength value of a signal previously received from the second terminal.

11. The terminal of claim 8,
    wherein the first sidelink signal corresponds to the second sidelink signal, and
    wherein the first sidelink signal and the second sidelink signal comprises hybrid automatic repeat request-acknowledgement (HARQ-ACK) information of the second terminal on a physical sidelink feedback channel (PSFCH).

12. The terminal of claim 8, wherein the at least one processor is further configured to acquire information on a resource pool from sidelink control information (SCI) for the second terminal.

13. The terminal of claim 8, wherein the at least one processor is further configured to identify a transmission beam used by the second terminal.

14. The terminal of claim 8, wherein
    the initial value is configured based on at least one value of a gain value used when previously receiving a signal from the second terminal, and a reception strength value of a signal previously received from the second terminal.

* * * * *